United States Patent
Kim et al.

(10) Patent No.: US 11,960,408 B2
(45) Date of Patent: Apr. 16, 2024

(54) SEMICONDUCTOR MEMORY DEVICE INCLUDING UNIT PAGE BUFFER BLOCKS HAVING FOUR PAGE BUFFER PAIRS

(71) Applicant: SK hynix Inc., Icheon-si (KR)

(72) Inventors: Dong Hyuk Kim, Icheon-si (KR); Tae Sung Park, Icheon-si (KR); Sang Hyun Sung, Icheon-si (KR); Sung Lae Oh, Icheon-si (KR); Soo Nam Jung, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 19 days.

(21) Appl. No.: 18/053,003

(22) Filed: Nov. 7, 2022

(65) Prior Publication Data
US 2023/0401157 A1    Dec. 14, 2023

(30) Foreign Application Priority Data
Jun. 13, 2022  (KR) .......................... 10-2022-0071308

(51) Int. Cl.
*G06F 12/00* (2006.01)
*G06F 12/0882* (2016.01)
*G06F 12/0895* (2016.01)
*G06F 12/123* (2016.01)

(52) U.S. Cl.
CPC ...... *G06F 12/0895* (2013.01); *G06F 12/0882* (2013.01); *G06F 12/125* (2013.01)

(58) Field of Classification Search
CPC . G06F 12/0895; G06F 12/0882; G06F 12/125
See application file for complete search history.

(56) References Cited

U.S. PATENT DOCUMENTS

| 10,664,395 B2 | 5/2020 | Oh et al. |
| 2022/0075687 A1* | 3/2022 | Jain ..................... G06F 11/1068 |

FOREIGN PATENT DOCUMENTS

| KR | 10-2021-0021676 A | 3/2021 |
| KR | 10-2022-0010360 A | 1/2022 |

* cited by examiner

*Primary Examiner* — Arvind Talukdar

(57) ABSTRACT

A unit page buffer block includes first to fourth page buffer pairs. Each of the page buffer pairs includes a common column decoder block; and an upper page buffer stage and a lower page buffer stage electrically and commonly connected to the common column decoder block. Each of the upper page buffer stages includes an upper selection block; an upper latch block; and an upper cache block. Each of the lower page buffer stage includes a lower selection block; a lower latch block; and a lower cache block. Each of the upper selection blocks includes first to fourth sub-selection blocks. Each of the upper and lower latch blocks includes first to twelfth upper sub-latch blocks. Each of the upper and lower cache blocks includes first to twelfth upper sub-cache blocks. Each of the common column decoder block includes first to third sub-common column decoder blocks arranged in a row direction.

19 Claims, 18 Drawing Sheets

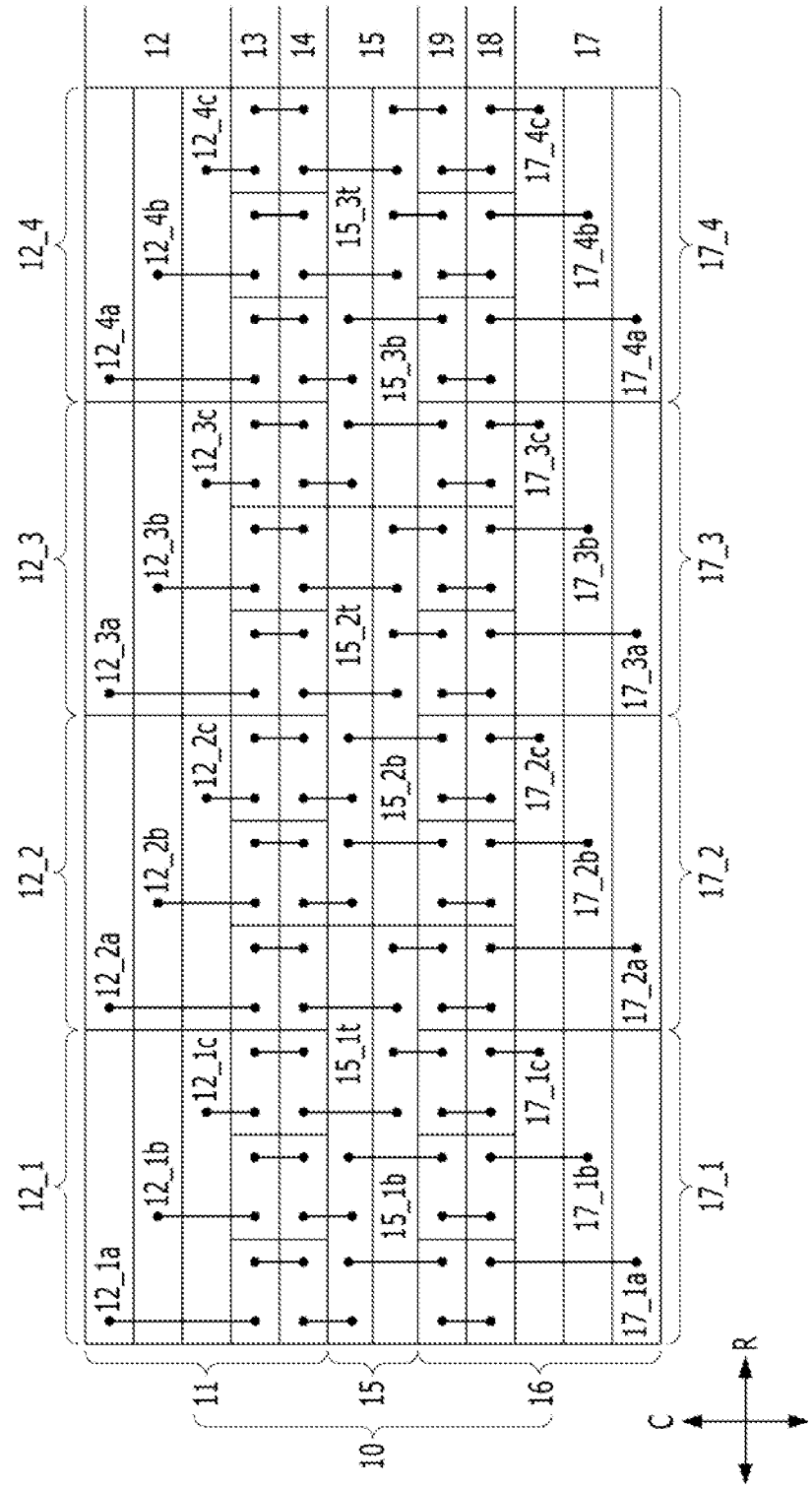

FIG. 5A

SEMICONDUCTOR MEMORY DEVICE INCLUDING UNIT PAGE BUFFER BLOCKS HAVING FOUR PAGE BUFFER PAIRS

The present application claims priority under 35 U.S.C. § 119 to Korean Patent Application No. 10-2022-0071308, filed on Jun. 13, 2022 in the Korean Intellectual Property Office, which is incorporated herein by reference in its entirety.

BACKGROUND

1. Field

The present disclosure relates to semiconductor memory devices including unit page buffer blocks having four page buffer pairs.

2. Description of the Related Art

In a semiconductor memory device technology having a page buffer circuit, there are studies and efforts to reduce the size of the semiconductor memory device.

SUMMARY

Embodiments of the present disclosure provide unit page buffer blocks and semiconductor memory devices including the unit page buffer blocks.

In accordance with an embodiment of the present disclosure, a semiconductor device includes a unit page buffer block including first to fourth page buffer pairs arranged in a column direction. Each of the first to fourth page buffer pairs includes a common column decoder block; and an upper page buffer stage and a lower page buffer stage electrically and commonly connected to the common column decoder block. Each of the upper page buffer stages includes an upper selection block; an upper latch block; and an upper cache block. Each of the lower page buffer stages includes a lower selection block; a lower latch block; and a lower cache block. Each of the upper selection blocks includes first to fourth sub-selection blocks arranged in a row direction. Each of the upper latch blocks includes first to twelfth upper sub-latch blocks arranged in the row direction. Each of the upper cache blocks includes first to twelfth upper sub-cache blocks arranged in the row direction. Each of the lower selection blocks includes first to fourth sub-section blocks arranged in the row direction. Each of the lower latch blocks includes first to twelfth lower sub-latch blocks arranged in the row direction. Each of the lower cache blocks includes first to twelfth lower sub-cache blocks arranged in the row direction. Each of the common column decoder blocks includes first to third sub-common column decoder blocks arranged in the row direction.

In accordance with an embodiment of the present disclosure, a semiconductor device includes a unit page buffer block including four page buffer pairs arranged in a column direction. Each of the page buffer pairs comprises a common column decoder block; and an upper page buffer stage and a lower page buffer stage, each electrically and commonly connected to the common column decoder block. The upper buffer stage comprises an upper selection block; an upper latch block; and an upper cache block. The lower buffer stage includes a lower selection block; a lower latch block; and a lower cache block. The upper selection block includes a plurality of upper sub-selection blocks arranged in a row direction. Each of the plurality of upper sub-selection blocks includes a plurality of upper unit selection blocks. The upper latch block includes a plurality of upper sub-latch blocks arranged in the row direction. The upper cache block includes a plurality of upper sub-cache blocks arranged in the row direction. Each of the plurality of upper unit selection blocks, each of the plurality of upper sub-latch blocks, and each of the plurality of upper sub-cache blocks are electrically connected to each other. The lower selection block includes a plurality of lower sub-selection blocks arranged in the row direction. Each of the plurality of lower sub-selection blocks includes a plurality of lower unit selection blocks. The lower latch block includes a plurality of lower sub-latch blocks arranged in the row direction. The lower cache block includes a plurality of lower sub-cache blocks arranged in the row direction. Each of the plurality of lower unit selection blocks, the plurality of lower sub-latch blocks, and each of the lower sub-cache blocks are electrically connected to each other.

In accordance with an embodiment of the present disclosure, a semiconductor device includes a unit page buffer block including first to fourth page buffer pairs arranged in a column direction. Each of the first to fourth page buffer pairs includes a common column decoder block; and an upper page buffer stage and a lower page buffer stage electrically connected to a corresponding common column decoder block. The common column decoder block includes first and second sub-common column decoder blocks. The upper page buffer stage includes an upper selection block; an upper latch block; and an upper cache block. The lower page buffer stage includes a lower selection block; a lower latch block; and a lower cache block. The upper selection block includes a first upper unit selection block and a second upper unit selection block arranged in the column direction. The upper latch block includes first and second upper sub-latch blocks arranged in the row direction. The upper cache block includes first and second upper sub-cache blocks arranged in the row direction. The lower selection block includes a first upper unit selection block and a first lower unit selection block arranged in the column direction. The lower latch block includes first and second lower sub-latch blocks arranged in the row direction. The lower cache block includes first and second lower sub-cache blocks arranged in the row direction. The first upper unit selection block, the first upper sub-latch block, and the first upper sub-cache block are electrically connected to each other. The second upper unit selection block, the second upper sub-latch block, and the second upper sub-cache block are electrically connected to each other. The first lower unit selection block, the first lower sub-latch block, and the first lower sub-cache block are electrically connected to each other. The second lower unit selection block, the second lower sub-latch block, and the second lower sub-cache block are electrically connected to each other. The first upper sub-cache block and the first lower sub-cache block are commonly electrically connected to the first sub-common column decoder. The second upper sub-cache block and the second lower sub-cache block are commonly electrically connected to the second sub-common column decoder block.

BRIEF DESCRIPTION OF THE DRAWINGS

FIGS. 3B and 3C are block diagrams schematically illustrating an electrical connection structure in the page buffer pair.

FIGS. 5A and 5B are block diagrams illustrating array configurations of even page buffers and odd page buffers of a unit page buffer block according to an embodiment of the present disclosure.

DETAILED DESCRIPTION

Figure 1:
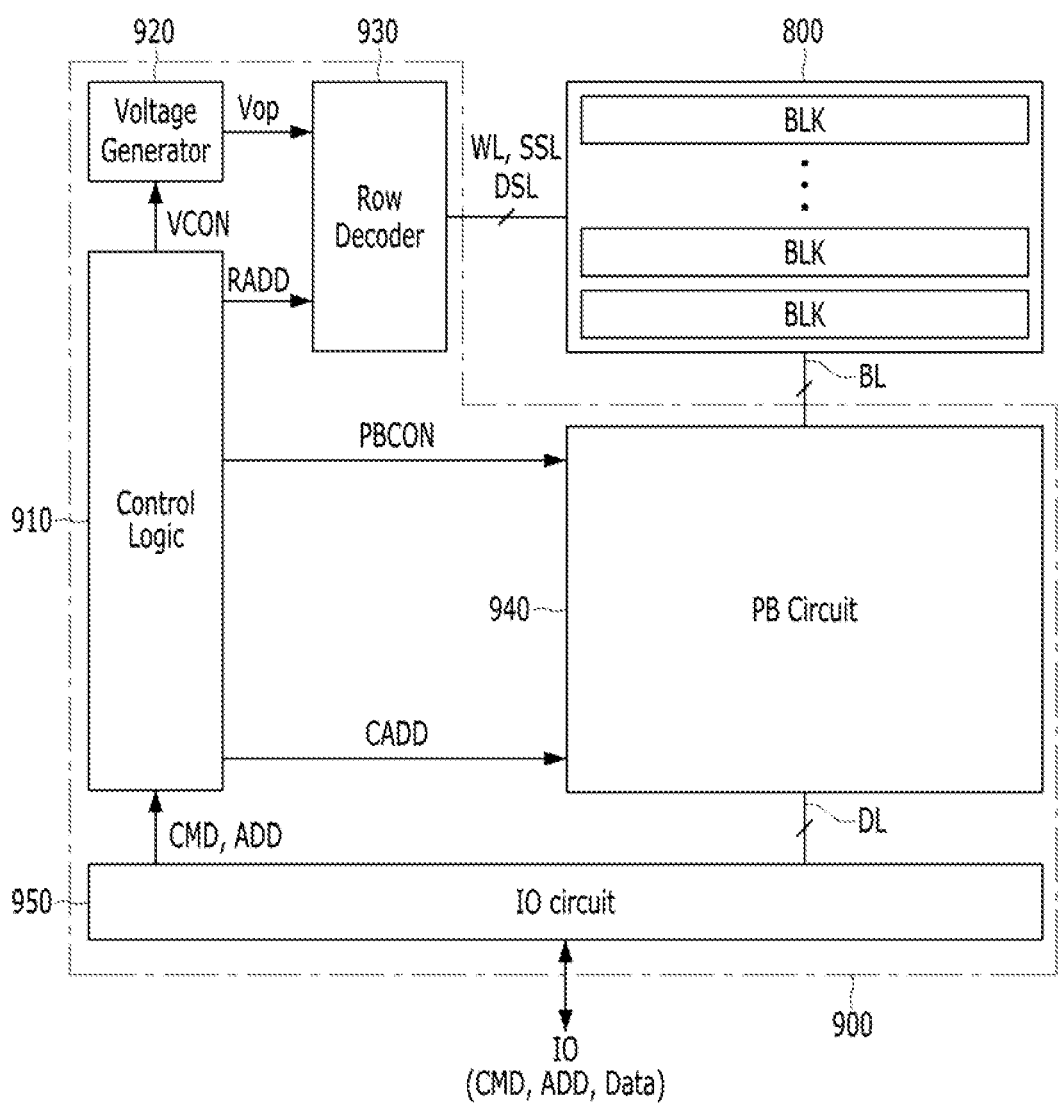
FIG. 1 is a block diagram schematically illustrating a semiconductor memory device according to an embodiment of the present disclosure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first" and/or "second" may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Other expressions that explain the relationship between elements, such as "between", "directly between", "adjacent to" or "directly adjacent to" should be construed in the same way.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a block diagram schematically illustrating a semiconductor memory device according to an embodiment of the present disclosure. Referring to FIG. 1, a semiconductor memory device according to an embodiment of the present disclosure may include a memory cell array 800 and peripheral circuits 900.

The memory cell array 800 may include a plurality of memory blocks BLK. The peripheral circuit 900 may include a control logic 910, a voltage generator 920, a row decoder 930, a page buffer circuit 940, and an input/output circuit 950. The memory cell array 800 may be connected to the row decoder 930 through word lines WL and selection lines. The selection lines may include a drain selection line DSL and a source selection line SSL. The memory cell array 800 may communicate with the page buffer circuit 940 through bit lines BL. For example, the memory cell array 800 may store data into the memory blocks BLK received from the page buffer circuit 940 during a programming operation or an erasing operation, and may provide the data stored in the memory blocks BLK to the page buffer circuit 940 during a reading operation.

The control logic 910 may generate a page buffer control signal PBCON to control the page buffer circuit 940 in response to the command signal CMD provided from the input/output circuit 950 and may provide the page buffer control signal PBCON to the page buffer circuit 940. The control logic 910 may generate a voltage control signal VCON to generate various voltages required in the semiconductor memory device in response to the command signal CMD provided from the input/output circuit 950 and may provide the voltage control signal VCON to the voltage generator 920. The control logic 910 may output a row address signal RADD and a column address signal CADD in response to the address signal ADD received from the input/output circuit 950.

The voltage generator 920 may generate various operating voltages Vop used in the programming operation, the reading operation, and the erasing operation in response to the voltage control signal VCON provided from the control logic 910. For example, the operating voltages Vop may include a programming voltage, a passing voltage, a reading voltage, and an erase voltage.

The row decoder 930 may select at least one of the memory blocks BLK of the memory cell array 800 in response to the row address signal RADD provided from the control logic 910. The row decoder 930 may provide at least one of the operating voltages Vop provided from the voltage generator 920 to the word lines WL and the selection lines DSL and SSL connected to the selected memory block BLK.

The page buffer circuit 940 may receive the page buffer control signal PBCON provided from the control logic 910 and receive/transmit the data signal DATA from/to the input/output circuit 950. The page buffer circuit 940 may control the bit lines BL arranged in the memory cell array 800 in response to the page buffer control signal PBCON. For example, the page buffer circuit 940 may sense signal levels of the bit lines BL of the memory cell array 800 in response to the page buffer control signal PBCON to detect the data stored in the memory cells of the memory cell array 800 and may provide data signal DATA to the input/output circuit 950 according to the detected data. The page buffer circuit 940 may provide an input signal to the bit line BL based on the data signal DATA provided from the input/output circuit 950 in response to the page buffer control signal PBCON, and thus the data may be written in the memory cells in the cell array 800. The page buffer circuit 940 may write or read out the data into or from the memory cells connected to the word lines WL enabled by the row decoder 930.

The input/output circuit 950 may provide the command signal CMD or the address signal ADD received from an external system to the control logic 910 or communicate with the page buffer circuit 940 through data lines DL. The input/output circuit 950 may include a plurality of input/output sense amplifiers to generate amplified data by amplifying a sensing voltage sensed from the data lines DL and output the generated data to the input/output port IO. The input/output port IO may include 2N data input/output pins (where the N is a natural number greater than or equal to 2). Typically, N is 3, in which case, the input/output port IO may include eight data input/output pins defined by IO<0> to IO<7>.

Figure 2A:
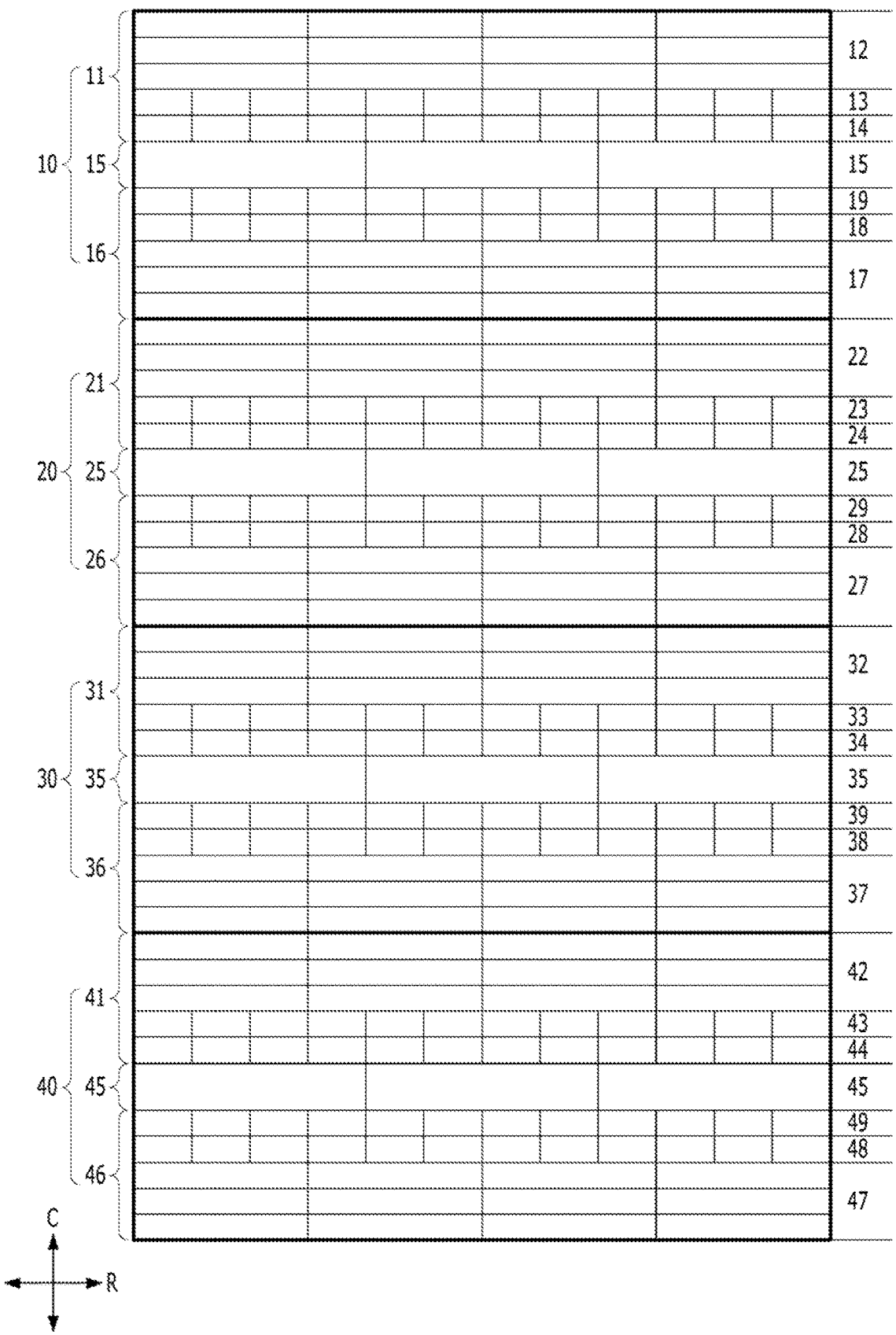
FIG. 2A is a block diagram illustrating an arrangement of circuit blocks in a unit page buffer block.
Figure 2B:
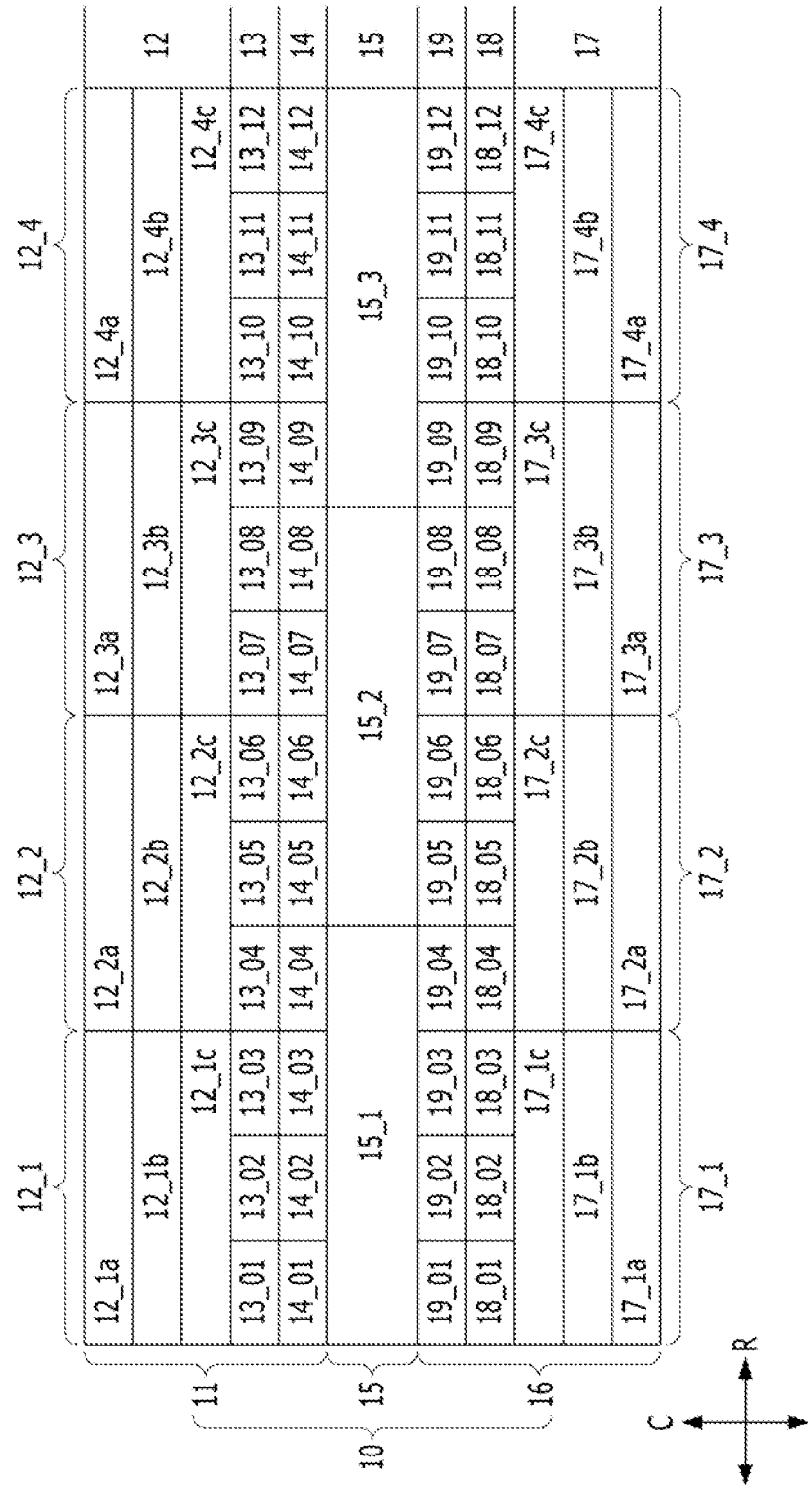
FIG. 2B is a block diagram illustrating an arrangement of circuit blocks in any one of the page buffer pairs in the unit page buffer block.

FIG. 2A is a block diagram illustrating an arrangement of circuit blocks in a unit page buffer block, such as uPB in a page buffer circuit 940 of a semiconductor memory device according to an embodiment of the present disclosure. FIG. 2B is a block diagram illustrating an arrangement of circuit blocks in any one of the page buffer pairs in the unit page buffer block, such as page buffer pairs 10, 20, 30, and 40 in the unit page buffer block uPB. The page buffer circuit 940 may include the unit page buffer blocks uPB arranged in a matrix shape.

Referring to FIGS. 2A and 2B, the unit page buffer block uPB of a semiconductor memory device according to an embodiment of the present disclosure may include first to fourth page buffer pairs 10, 20, and 40 arranged to be adjacent to each other in a column direction C. Each of the first to fourth page buffer pairs 10, 20, 30, and 40 may include one of first to fourth common column decoder blocks 15, 25, 35 and 45, one of first to fourth upper page buffer stages 11, 21, 31, and 41, and one of the first to fourth lower page buffer stages 16, 26, 36, and 46. Specifically, the first page buffer pair 10 may include the first common column decoder block 15, the first upper page buffer stage 11, and the first lower page buffer stage 16; the second page buffer pair 20 may include the second common column decoder block 25, the second upper page buffer stage 21, and the second lower page buffer stage 26; the third page buffer pair 30 may include the third common column decoder block 35, the third upper page buffer stage 31, and the third lower page buffer stage 36; and the fourth page buffer pair 40 may include the fourth common column decoder block 45, the fourth upper page buffer stage 41, and the fourth lower page buffer stage 46. That is, the unit page buffer block uPB may include eight page buffer stages 11, 16, 21, 26, 31, 36, 41, and 46. One of the corresponding upper page buffer stages 11, 21, 31, and 41 and one of the corresponding lower page buffer stages 16, 26, 36, and 46 may be commonly and electrically connected to one of the corresponding common column decoder blocks 15, 25, 35, and 45. Specifically, the first upper page buffer stage 11 and the first lower page buffer stage 16 may be commonly and electrically connected to the first common column decoder block 15, the second upper page buffer stage 21 and the second lower page buffer stage 26 may be commonly and electrically connected to the second common column decoder block 25, the third upper page buffer stage 31 and the third lower page buffer stage 36 may be commonly and electrically connected to the third common column decoder block 35, and the fourth upper page buffer stage 41 and the fourth lower page buffer stage 46 may be commonly and electrically connected to the fourth common column decoder block 45. The corresponding upper page buffer stages 11, 21, 31, and 41 and the corresponding lower page buffer stages 16, 26, 36, and 46 may be arranged symmetrically or mirrored to each other in the column direction C.

Although a configuration of the first page buffer pair 10 is representatively illustrated in FIG. 2B, the second to fourth page buffer pairs 20, 30, and 40 may also have the same configuration as the first page buffer pair 10. Therefore, 'first' is omitted from the first page buffer pair 10 in the following description. Referring to FIG. 2B, the upper page buffer stage 11 may include an upper selection block 12, an upper latch block 13, and an upper cache block 14 arranged in the column direction C. The lower page buffer stage 16 may include a lower selection block 17, a lower latch block 18, and a lower cache block 19 arranged in the column direction C.

The upper selection block 12 may include four upper sub-selection blocks 12_1, 12_2, 12_3, and 12_4 arranged to be adjacent to each other in a row direction R. The lower selection block 17 may include four lower sub-selection blocks 17_1, 17_2, 17_3, and 17_4 arranged to be adjacent to each other in the row direction. Each of the upper sub-selection blocks 12_1, 12_2, 12_3, and 12_4 may include first to third upper unit selection blocks 12_1a-12_1c, 12_2a-12_2c, 12_3a-12_3c, and 12_4a-12_4c, respectively arranged to be adjacent to each other in the column direction C. Each of the lower sub-selection blocks 17_1, 17_2, 17_3, and 17_4 may include first to third lower unit selection blocks 17_1a-17_1c, 17_2a-17_2c, 17_3a-17_3c, and 17_4a-17_4c, respectively arranged to be adjacent to each other in the column direction C.

The upper latch block 13 may include twelve upper sub-latch blocks 13_01-13_12 arranged to be adjacent to each other in the row direction R. The lower latch block 18 may include twelve lower sub-latch blocks 18_01-18_12 arranged to be adjacent to each other in the row direction R.

The upper cache block 14 may include twelve upper sub-cache blocks 14_01-14_12 arranged to be adjacent to each other in the row direction R, and the lower cache block 19 may include twelve lower sub-cache blocks 19_01-19_12 arranged to be adjacent to each other in the row direction R.

The common column decoder block 15 may include three sub-common column decoder blocks 15_1-15_3 arranged in the row direction R.

Figure 3A:
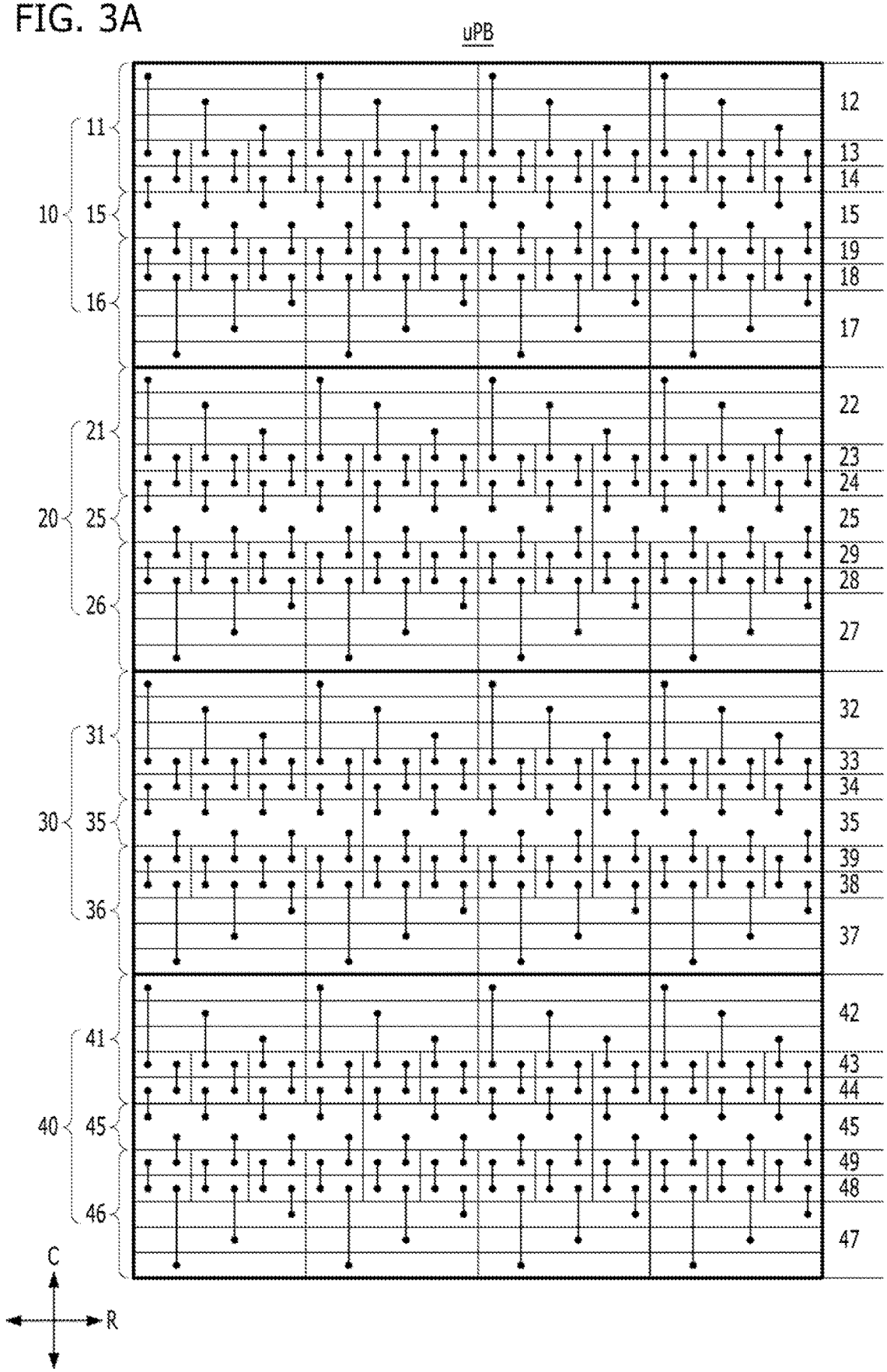
FIG. 3A is a block diagram schematically illustrating an electrical connection structure of a unit page buffer block according to an embodiment of the present disclosure.
Figure 3C:
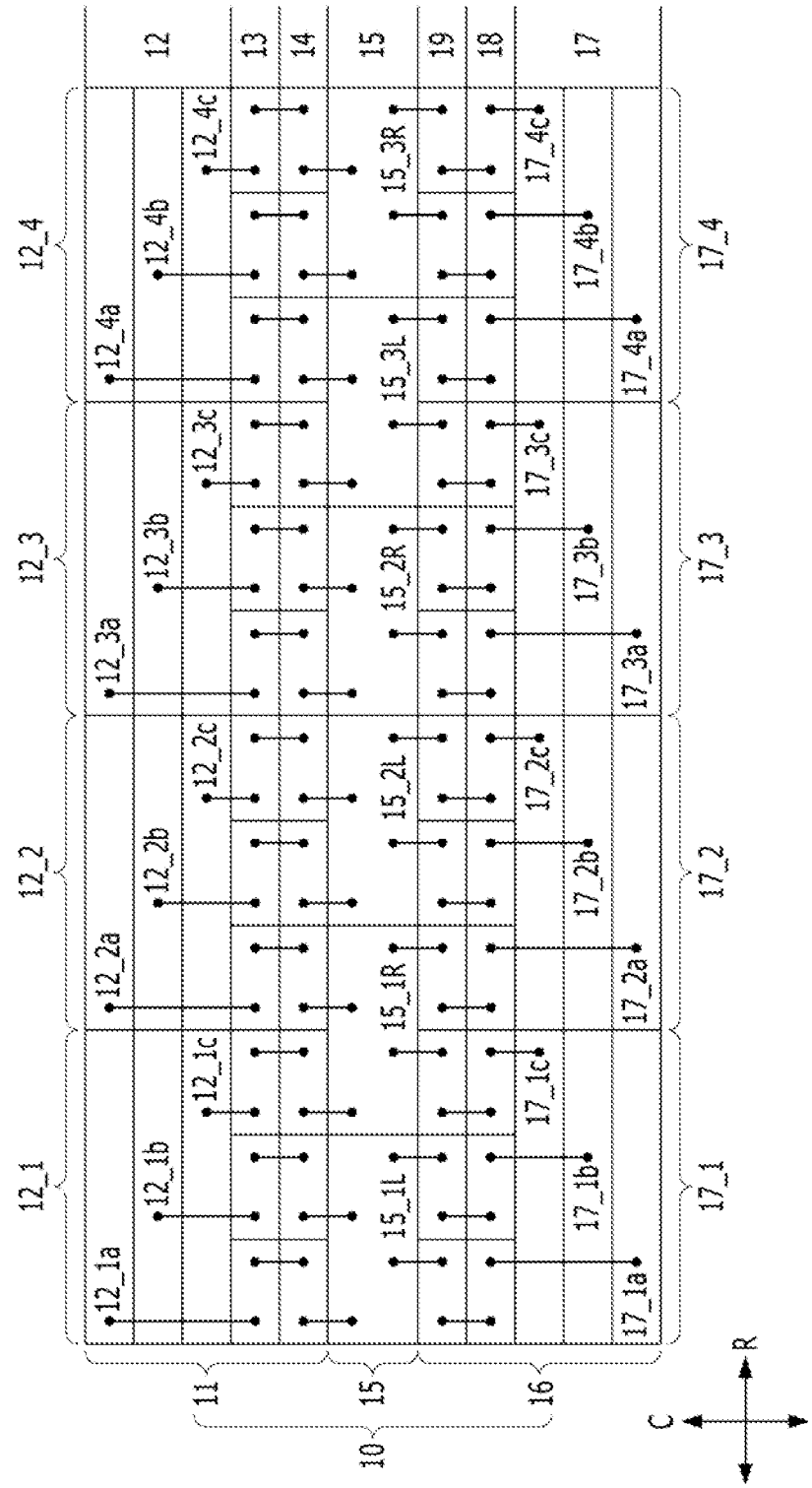

FIG. 3A is a block diagram schematically illustrating an electrical connection structure of a unit page buffer block, such as uPB, according to an embodiment of the present disclosure. FIGS. 3B and 3C are block diagrams schematically illustrating an electrical connection structure in the page buffer pair. Although the configuration of a first page buffer pair 10 is representatively illustrated in FIG. 3B, the second to fourth page buffer pairs 20, 30, and 40 may also have the same configuration as the first page buffer pair 10. Therefore, 'first' is omitted from the first page buffer pair 10 in the following description.

Referring to FIGS. 3A to 3C, the first to third upper unit selection blocks 12_1a-12_1c, 12_2a-12_2c, 12_3a-12_3c, and 12_4a-12_4c, and the corresponding upper sub-latch blocks 13_01-13_12 may be electrically connected to each other, and the upper sub-latch blocks 13_01-13_12 and the corresponding upper sub-cache blocks 14_01-14_12 may be electrically connected to each other. That is, each corresponding one of the twelve upper unit selection blocks 12_1a-12_1c, 12_2a-12_2c, 12_3a-12_3c, and 12_4a-12_4c, each corresponding one of the twelve upper sub-latch blocks 13_01-13_12, and each corresponding one of the twelve upper sub-cache blocks 14_01-14_12 may be electrically connected to each other, respectively. Each corresponding one of the twelve first to third lower unit selection blocks 17_1a-17_1c, 17_2a-17_2c, 17_3a-17_3c, and 17_4a-17_4c, each corresponding one of the twelve lower sub-latch blocks 18_01-18_12, and each corresponding one of the twelve lower sub-cache blocks 19_01-19_12 may be electrically connected to each other, respectively.

Four upper sub-selection blocks 12_1-12_4 and four lower sub-selection blocks 17_1-17_4 are arranged in the row direction R, respectively, and the upper unit selection blocks 12_1a-12_1c, 12_2a-12_2c, 12_3a-12_3c, and 12_4a-12_4c, and the lower unit selection blocks 17_1a-17_1c, 17_2a-17_2c, 17_3a-17_3c, and 17_4a-17_4c are arranged in three tiers in the column direction C, respectively. Accordingly, electrical connections between the upper and lower unit selection blocks 12_1a-12_1c, 12_2a-12_2c, 12_3a-12_3c, 12_4a-12_4c, 17_1a-17_1c, 17_2a-17_2c, 17_3a-17_3c, and 17_4a-17_4c and the upper and lower sub-latch blocks 13_01-13_12 and 18_01-18_12 may be repeated in the row direction with a period of three connections, respectively. For easy understanding of the technical concepts of the present disclosure, the electrical connections between the upper and lower unit selection blocks 12_1a-12_1c, 12_2a-12_2c, 12_3a-12_3c, 12_4a-12_4c, 17_1a-17_1c, 17_2a-17_2c, 17_3a-17_3c, 17_4a-17_4c and the corresponding upper and lower sub-latch blocks 13_01-13_12 and 18_01-18_12 are assumed to be vertically symmetrical, respectively, across column decoder block 15. Each of the upper and lower unit selection blocks 12_1a-12_1c, 12_2a-12_2c, 12_3a-12_3c, 12_4a-12_4c, 17_1a-17_1c, 17_2a-17_2c, 17_3a-17_3c, and 17_4a-17_4c may be electrically connected to one of a plurality of bit lines. Each of the upper and lower unit selection blocks 12_1a-12_1c, 12_2a-12_2c, 12_3a-12_3c, 12_4a-12_4c, 17_1a-17_1c, 17_2a-17_2c, 17_3a-17_3c, and 17_4a-17_4c may include a switching device, such as for example, a selection transistor. The bit lines may be electrically connected to the corresponding upper and lower sub-latch blocks 13_01-13_12 and 18_01-18_12 according to a turn-on state or a turn-off state of the selection transistors.

Referring to FIG. 3B, in an embodiment, each of the sub-common column decoder blocks 15_1-15_3 may include one of upper sub-common column decoder blocks 15_1t-15_3t and one of lower sub-common column decoder blocks 15_1b-15_3b. Four of the upper and lower sub-cache blocks 14_01-14_12 and 19_01-19_12 may be electrically and commonly connected to one of the upper and lower sub-common column decoder blocks 15_1t-15_3t and 15_1b-15_3b. For example, two of the upper sub-cache blocks 14_01-14_12 of the upper page buffer stage 11 and two of the lower sub-cache blocks 19_01-19_12 of the lower page buffer stage 16 may be electrically connected to the same one of the upper and lower sub-common column decoder blocks 15_1t-15_3t and 15_1b-15_3b.

Referring to FIG. 3C, in another embodiment, the sub-common column decoder blocks 15_1-15_3 may include one of the left sub-common column decoder blocks 15_1L-15_3L and one of the right sub-common column decoder blocks 15_1R-15_3R, respectively. Four of the upper and lower sub-cache blocks 14_01-14_12 and 19_01-19_12 may be electrically and commonly connected to one of the left and right sub-common column decoder blocks 15_1L-15_3L and 15_1R-15_3R. For example, two of the upper sub-cache blocks 14_01-14_12 of the upper page buffer stage 11 and two of the lower sub-cache blocks 19_01-19_12 of the lower page buffer stage 16 may be electrically connected to the same one of the left and right sub-common column decoder blocks 15_1L-15_3L and 15_1R-15_3R.

The inventive concepts of the present disclosure are not limited to the electrical connections shown in FIGS. 3A to 3C and can be variously expanded. For example, in FIGS. 3A to 3C, although the electrical connection between the upper unit selection blocks 12_1a-12_1c, 12_2a-12_2c, and 12_3a-12_3c and the upper sub-latch blocks 13_01-13_12, and the electrical connections between the lower unit selection blocks 17_1a-17_1c, 17_2a-17_2c, and 17_3a-17_3c and the lower sub-latch blocks 18_01-18_12 are illustrated in a symmetrical form or arrangement or a mirrored form or arrangement, in other embodiments, the electrical connections may not be symmetrical form or arrangement or the mirrored form or arrangement. For example, the electrical connections may be shaped to have the same interconnection length.

Figure 4A:
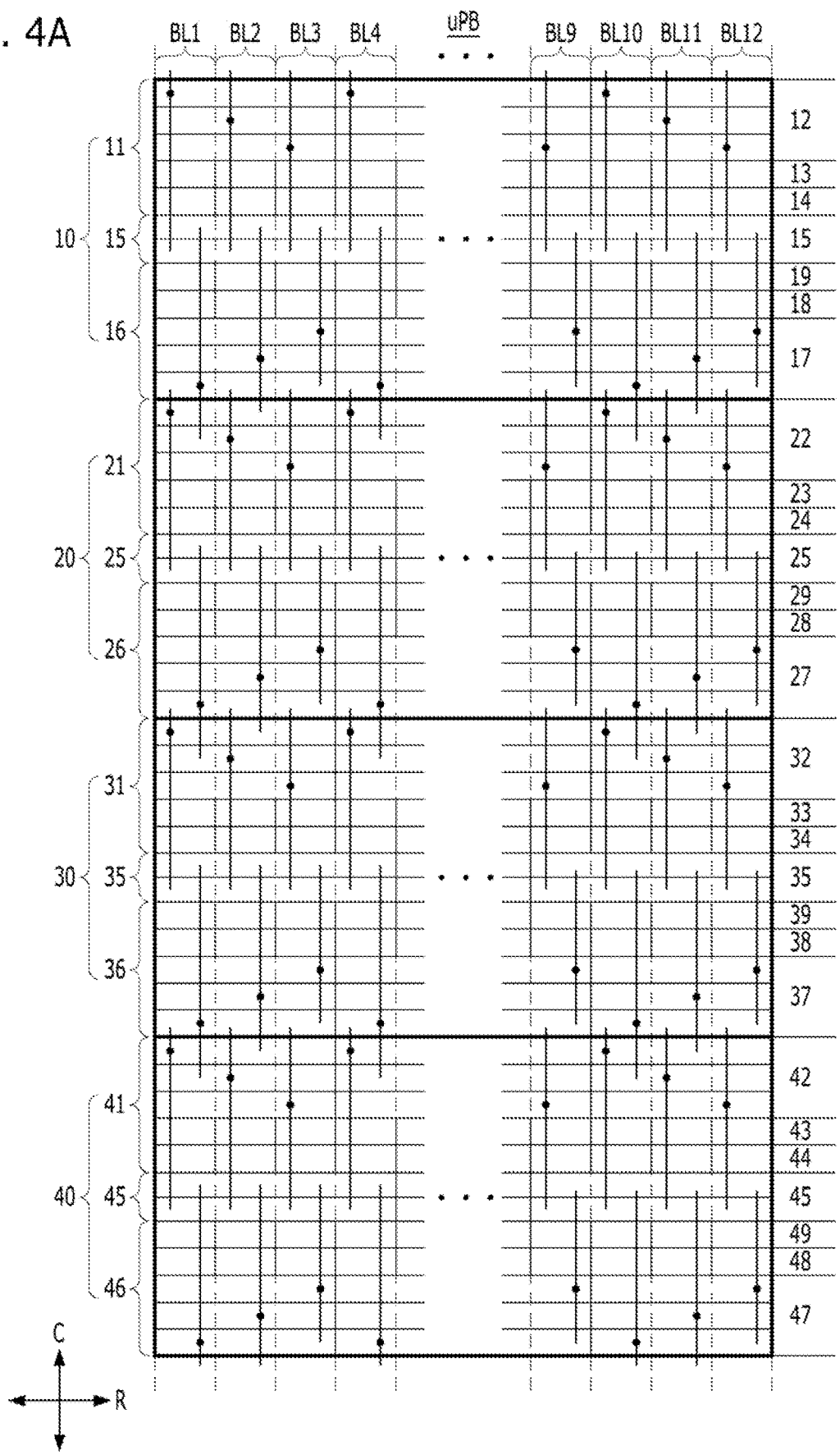
FIG. 4A is a schematic block diagram illustrating a unit page buffer block and bit line sets of a semiconductor memory device according to an embodiment of the present disclosure.
Figure 4B:
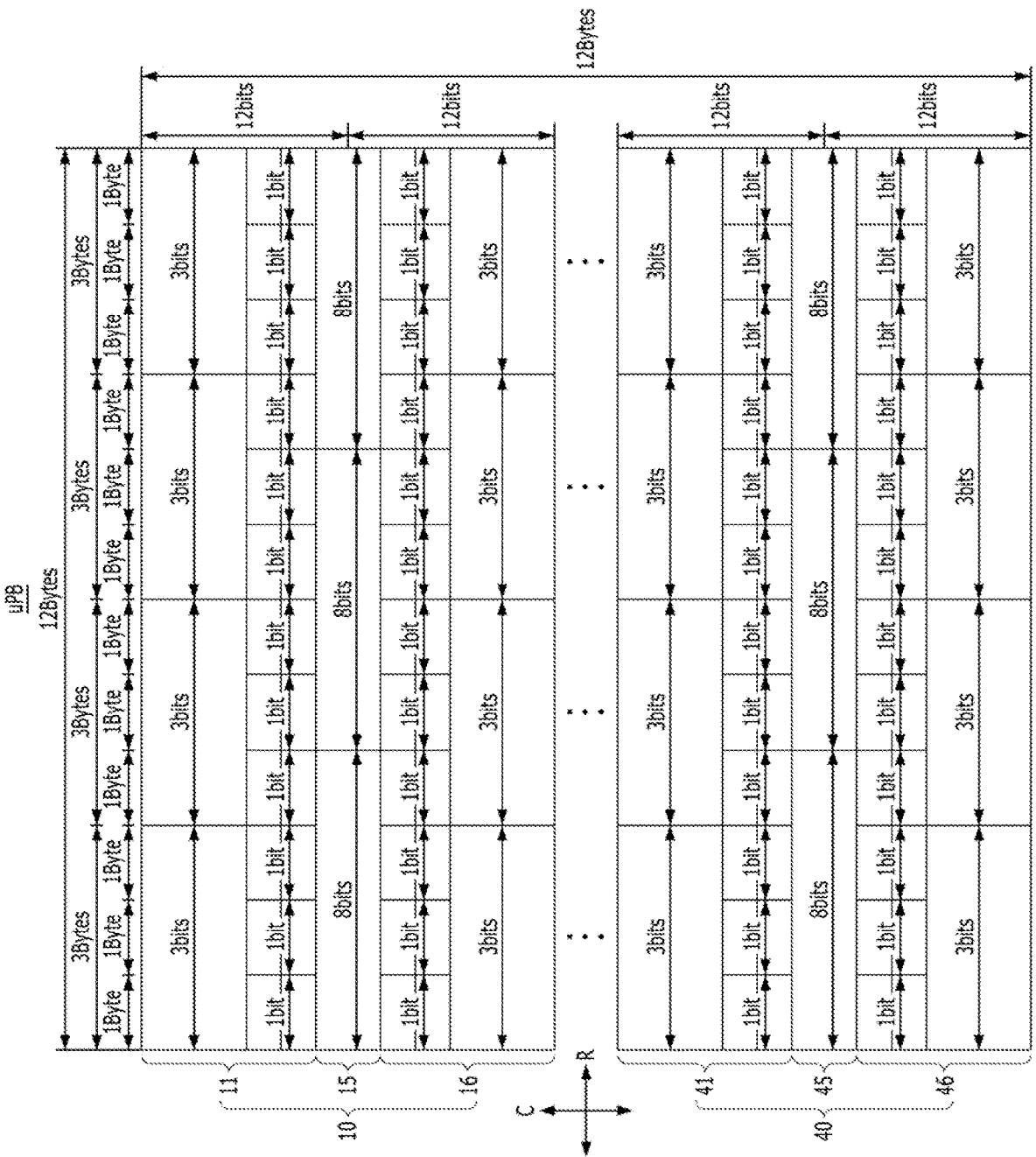
FIG. 4B is a block diagram illustrating an array configuration of a unit page buffer block.

FIG. 4A is a schematic block diagram illustrating electric connections between a unit page buffer block and bit line sets of a semiconductor memory device according to an embodiment of the present disclosure. FIG. 4B is a block diagram illustrating an array configuration of a unit page buffer block. Referring to FIG. 4A, bit line sets BL1-BL12 may extend in the column direction C to intersect the page buffer pairs 10, 20, 30, and 40. A pitch of the bit line sets BL1-BL12 in the row direction R may be the same as widths of the upper and lower sub-latch blocks 13_01-13_12 and 18_01-18_12 and the upper and lower sub-cache blocks 14_01-14_12 and 19_01-19_12 in the row direction R. Accordingly, each of the bit line sets BL1-BL12 may extend in the column direction C to intersect each one of the upper sub-latch blocks 13_01-13_12, each one of the lower sub-latch blocks 18_01-18_12, each one of the upper sub-cache blocks 14_01-14_12, and each one of the lower sub-cache blocks 19_01-19_12 arranged in the column direction C. Each of the upper sub-selection blocks 12_1-12_4 and each of the lower sub-selection blocks 17_1-17_4 arranged in the column direction C may intersect three sets of the bit line sets BL1-BL12. Each of the sub-common column decoder blocks 15_1-15_3 may intersect four sets of the bit line sets BL1-BL12. Because twelve upper sub-latch blocks 13_01-13_12, twelve lower sub-latch blocks 18_01-18_12, twelve upper sub-cache blocks 14_01-14_12, and twelve lower sub-cache blocks 19_01-19_12 are arranged in the row direction R, respectively, twelve bit line sets BL1-BL12 may be arranged in the row direction R. Each of the bit line sets BL1-BL12 may include eight bit lines. Accordingly, ninety six bit lines may be arranged in the row direction R.

Referring to FIGS. 2B and 4B, each of the upper and lower sub-latch blocks 13_01-13_12 and 18_01-18_12 and each of the upper and lower sub-cache blocks 14_01-14_12 and 19_01-19_12 may have a 1-bit array configuration. Since twelve upper and lower sub-latch blocks 13_01-13_12 and 18_01-18_12 and twelve upper and lower sub-cache blocks 14_01-14_12 and 19_01-19_12 are arranged in the row direction R, each of the upper and lower latch blocks 13 and 18 and each of the upper and lower cache blocks 14 and 19 in each of upper and lower the page buffer stages 11 and 16 may have a 12-bit array configuration.

Each of the upper and lower unit selection blocks 12_1a-12_1c, 12_2a-12_2c, 12_3a-12_3c, 12_4a-12_4c, 17_1a-17_1c, 17_2a-17_2c, 17_3a-17_3c, and 17_4a-17_4c of each of the upper and lower sub-selection blocks 12_1-12_4 and 17_1-17_4 may have a 1-bit array configuration. Accordingly, each of the upper and lower sub-selection blocks 12_1-12_4 and 17_1-17_4 may have a 3-bit array configuration. Since four upper sub-selection blocks 12_1-12_4 and four lower sub-selection blocks 17_1-17_4 are arranged in the row direction in each of the upper and lower page buffer stages 11 and 16, each of the upper and lower selection blocks 12 and 17 in each of the upper and lower page buffer stages 11 and 16 may have a 12-bit array configuration.

Each of the sub-common column decoder blocks 15_1-15_3 may have an 8-bit array configuration. Because three sub-common column decoder blocks 15_1-15_3 are arranged in the row direction R in the page buffer pair 10, the common column decoder block 15 in the page buffer pair 10 may have a 24-bit array configuration. As described above, each of the common column decoder blocks 15, 25, 35, and 45 may be divided into two in each of the page buffer pairs 10, 20, 30, and 40, and may be included in the upper and lower page buffer stages 11, 16, 21, 26, 31, 36, 41, and 46, respectively. Accordingly, each of the common column decoder blocks 15, 25, 35, and 45 may have two 12-bit array configurations.

Each of the upper and lower page buffer stages 11 and 16 may have a 12-bit array configuration, and one page buffer pair 10 may have a 24-bit array configuration. Since the unit page buffer block uPB may include the four page buffer pairs 10, 20, 30, and 40, (i.e., eight page buffer stages 11, 16, 21, 26, 31, 36, 41, and 46) arranged in the column direction C in which the bit line sets BL1-BL12 extend, the unit page buffer block uPB may have a 12-byte array configuration (i.e., 96 bit lines).

Figure 5A:
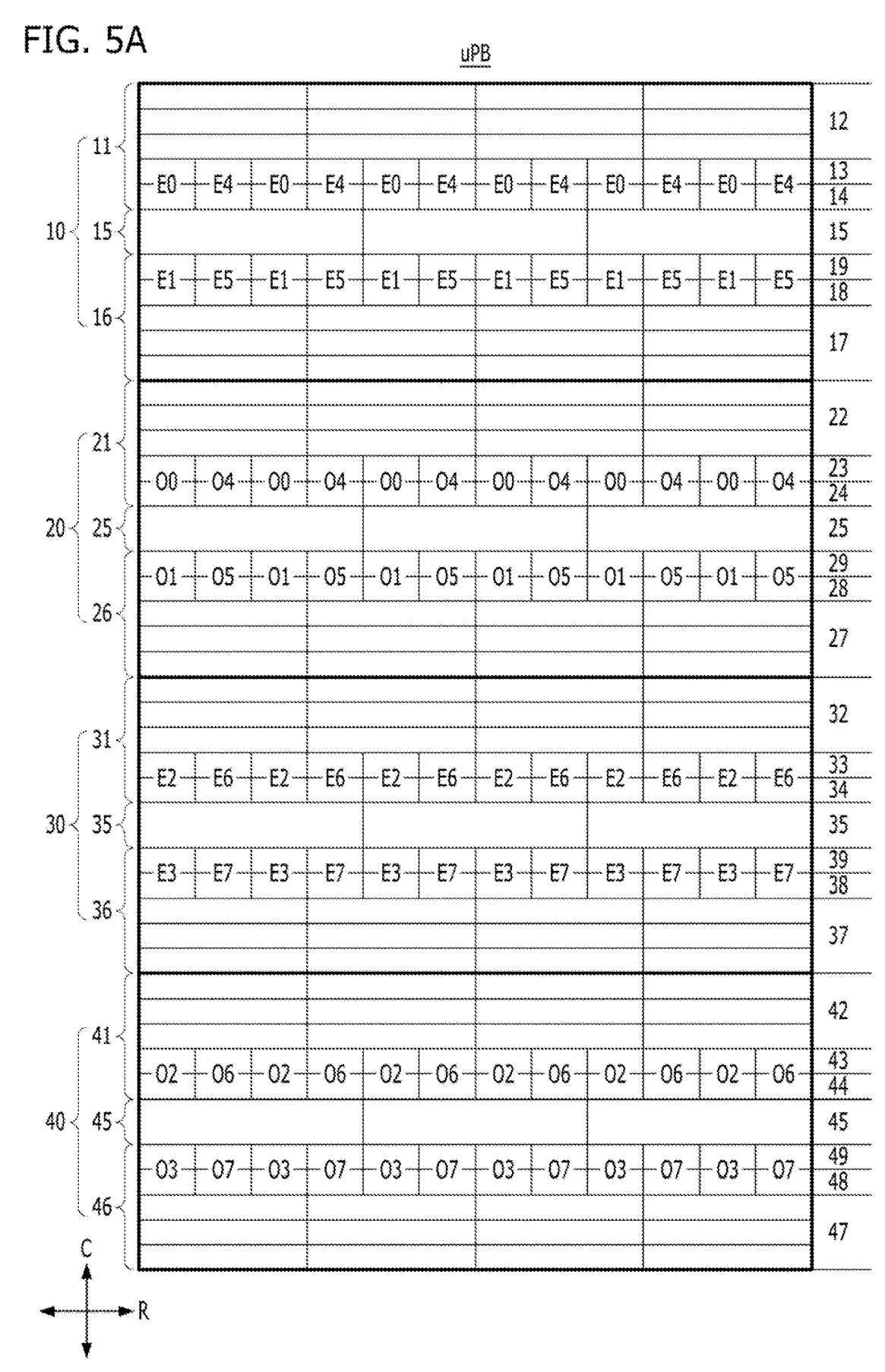
Figure 5B:
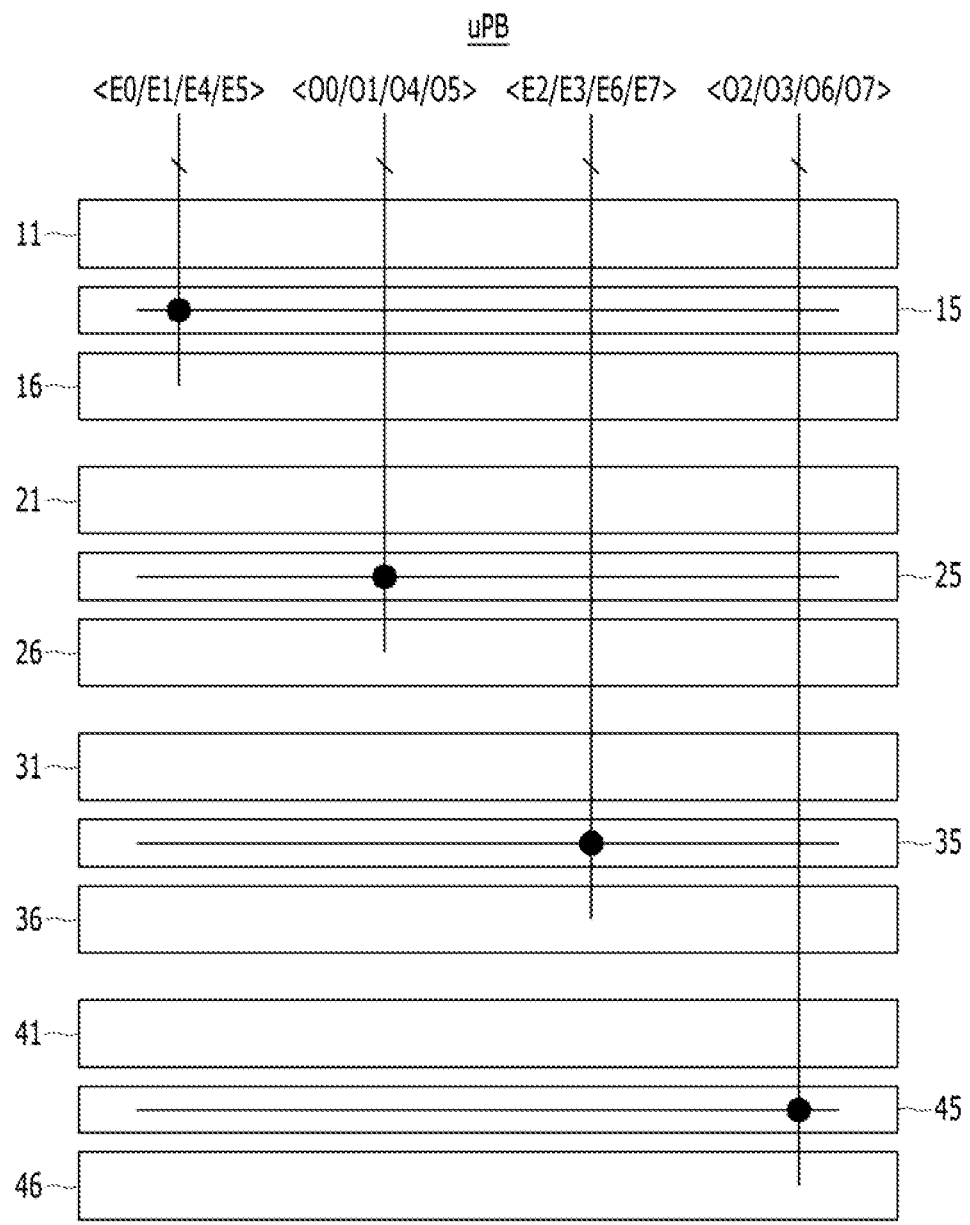

FIGS. 5A and 5B are block diagrams illustrating array configurations of even page buffers and odd page buffers of the unit page buffer block of a semiconductor memory device according to an embodiment of the present disclosure. Referring to the unit page buffer block uPB arranged in the page buffer circuit 940 in the memory cell array 800 and FIGS. 4A, 4B, 5A, and 5B, the first common column decoder block 15 of the first page buffer pair 10 may be electrically connected to the bit lines E0, E1, E4, and E5; the second common column decoder block 25 of the second page buffer pair 20 may be electrically connected to the bit lines O0, O1, O4, and O5; the third common column decoder block 35 of the third page buffer pair 30 may be electrically connected to the bit lines E2, E3, E6, and E7; and the fourth common column decoder block 45 of the fourth page buffer pair may be electrically connected to the bit lines O2, O3, O6, and O7. That is, the upper and lower selection blocks 12, 17, 32, and 37, the upper and lower latch blocks 13, 18, 33, and 38, the upper and lower cache blocks 14, 19, 34, and 39, and the common column decoder blocks 15 and 35 of the first and third page buffer pairs 10 and 30 may be electrically connected to the even bit lines, and the upper and lower selection blocks 22, 27, 42, and 47, the upper and lower latch blocks 23, 28, 43, and 48, the upper and lower cache blocks 24, 29, 44, and 49, and the common column decoder blocks 25, 45 of the second and fourth page buffer pairs 20 and 40 may be electrically connected to the odd bit lines. The common column decoder blocks 15, 25, 35, and 45 may be selectively connected to the even bit lines or the odd bit lines. That is, each of the common column decoder blocks 15, 25, 35 and 45 are not simultaneously connected to both the even bit lines and the odd bit lines.

Figure 6A:
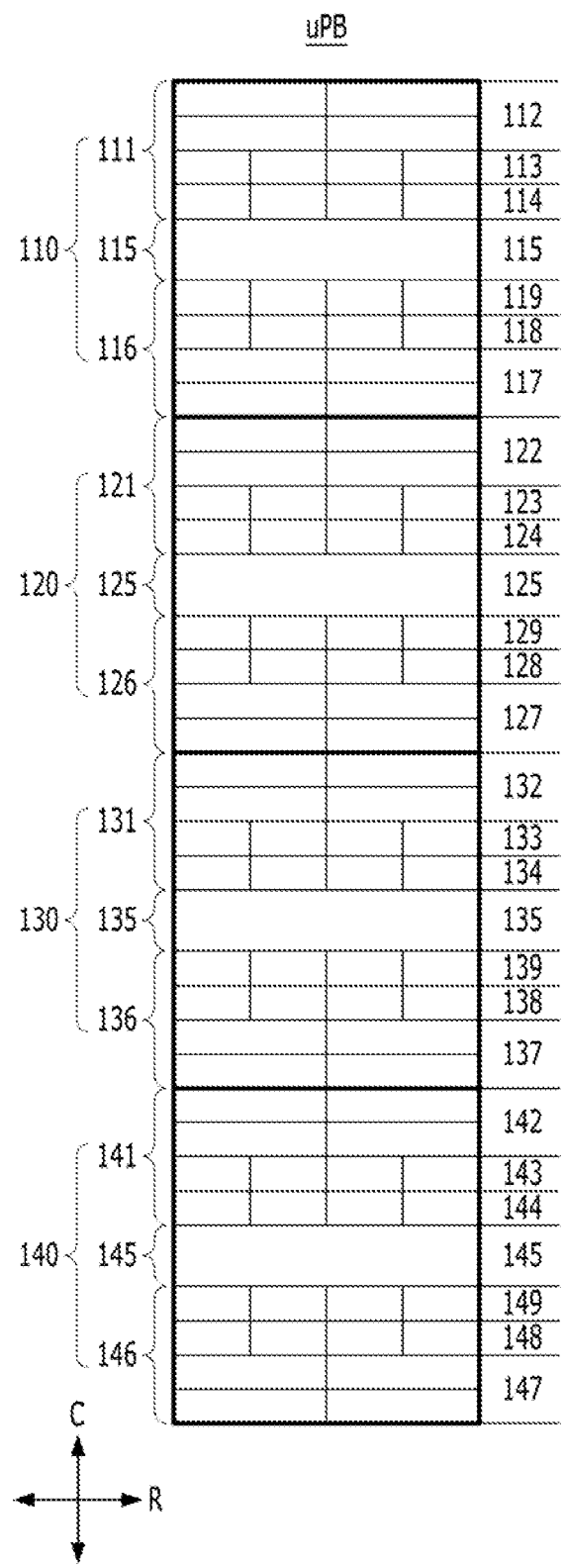
FIGS. 6A to 6E are block diagrams illustrating an arrangement and electrical connections of circuit blocks in a unit page buffer block according to an embodiment of the present disclosure.
Figure 6B:
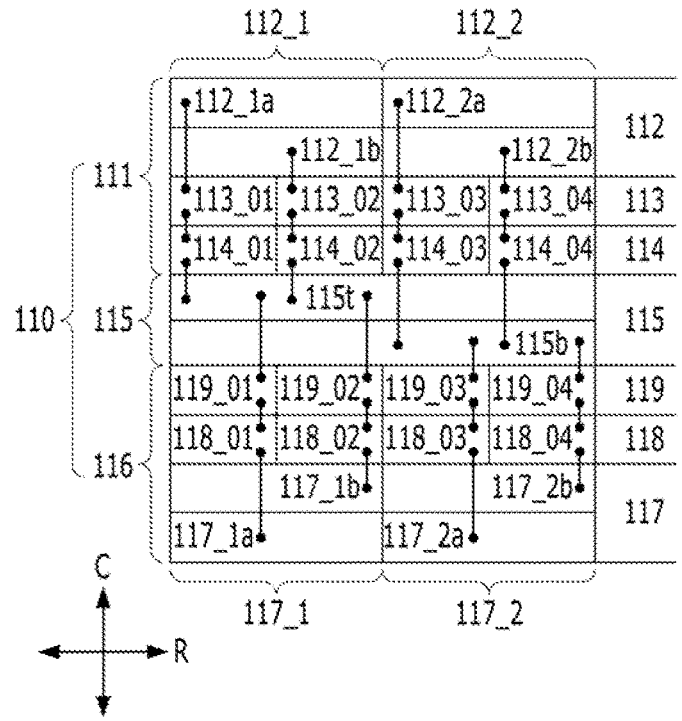
Figure 6C:
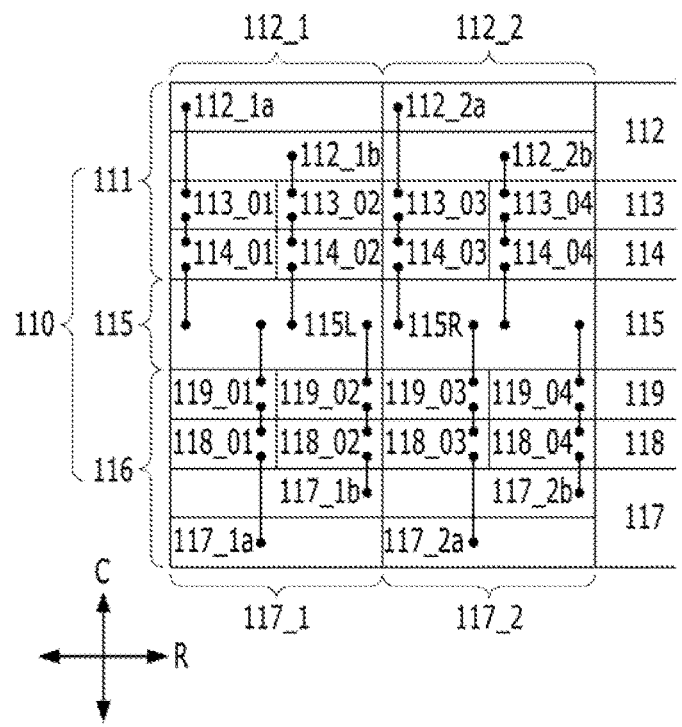

FIGS. 6A to 6E are block diagrams illustrating an arrangement and electrical connections of circuit blocks in a unit page buffer block of a semiconductor memory device according to an embodiment of the present disclosure. Referring to FIGS. 6A to 6C, the unit page buffer block uPB in the page buffer circuit 940 of the semiconductor memory device according to an embodiment of the present disclosure may include first to fourth page buffer pairs 110, 120, 130, and 140 arranged in the column direction C. Each of the first to fourth page buffer pairs 110, 120, 130, and 140 may include one of first to fourth common column decoder blocks 115, 125, 135 and 145, one of first to fourth upper page buffer stages 111, 121, 131, and 141, and one of first to fourth lower page buffer stages 116, 126, 136, and 146. Specifically, the first page buffer pair 110 may include the first common column decoder block 115, the first upper page buffer stage 111, and the first lower page buffer stage 116; the second page buffer pair 120 may include the second common column decoder block 125, the second upper page buffer stage 121, and the second lower page buffer stage 126; and the third page buffer pair 130 may include the third common column decoder block 135, the third upper page buffer stage 131, and the third lower page buffer stage 136; and the fourth page buffer pair 140 may include the fourth common column decoder block 145, the fourth upper page buffer stage 141, and the fourth lower page buffer stage 146. That is, the unit page buffer block uPB may include eight page buffer stages 111, 116, 121, 126, 131, 136, 141, and 146.

One of the corresponding upper page buffer stages 111, 121, 131, and 141 and one of the corresponding lower page buffer stages 116, 126, 136, and 146 may be commonly connected to one of the corresponding common column decoder blocks 115, 125, 135, and 145. Specifically, the first upper page buffer stage 111 and the first lower page buffer stage 116 may be commonly connected to the first common column decoder block 115, the second upper page buffer stage 121 and the second lower page buffer stage 126 may be commonly connected to the second common column decoder block 125, the third upper page buffer stage 131 and the third lower page buffer stage 136 may be connected to the third common column decoder block 135, and the fourth upper page buffer stage 141 and the fourth lower page buffer stage 146 may be commonly connected to the fourth common column decoder block 145. The corresponding upper page buffer stages 111, 121, 131, and 141 and the lower page buffer stages 116, 126, 136, and 146 may be arranged symmetrically or mirrored to each other in the column direction C.

Although the configuration of the first page buffer pair 110 is representatively illustrated in FIGS. 6B and 6C, the second to fourth page buffer pairs 120, 130, and 140 may also have the same configuration as the first page buffer pair 110. Therefore, 'first' is omitted from the first page buffer pair 110 in the following description. Referring to FIGS. 6B and 6C, the upper page buffer stage 111 may include the upper selection block 112, the upper latch block 113, and the upper cache block 114 arranged in the column direction C. The lower page buffer stage 116 may include the lower selection block 117, the lower latch block 118, and the lower cache block 119 arranged in the column direction (C).

The upper selection block 112 may include two upper sub-selection blocks 112_1 and 112_2 arranged in the row direction R, and the lower selection block 117 may include two lower sub-selection blocks 117_1 and 117_2 arranged in the row direction R. Each of the upper sub-selection blocks 112_1 and 112_2 may include two upper unit selection blocks 112_1a-112_1b and 112_2a-112_2b arranged in the column direction C, and each of the lower sub-selection blocks 117_1, 117_2 may include two lower unit selection blocks 117_1a-117_1b and 117_2a-117_2b arranged in the column direction C.

The upper latch block 113 may include four upper sub-latch blocks 113_01-113_04 arranged in the row direction R, and the lower latch block 118 may include four lower sub-latch blocks 118_01-118_04 arranged in the row direction R.

The upper cache block 114 may include four upper sub-cache blocks 114_01-114_04 arranged in the row direction R, and the lower cache block 119 may include four lower sub-cache blocks 119_01-119_04 arranged in the row direction R.

Referring to FIG. 6B, the common column decoder block 115 may include an upper sub-common column decoder block 115t and a lower sub-common column decoder block 115b arranged in the column direction C. Referring to FIG. 6C, the common column decoder block 115 may include a left sub-common column decoder block 115L and a right sub-common column decoder block 115R arranged in the row direction R.

Referring to FIGS. 6B and 6C, each corresponding one of the upper unit selection blocks 112_1a-112_1b and 112_2a-112_2b, each corresponding one of the upper sub-latch blocks 113_01-113_04, and each corresponding one of the upper sub-cache blocks 114_01-114_04 may be electrically connected to each other, respectively, and each corresponding one of the lower unit selection blocks 117_1a-117_11) and 117_2a-117_2b, each corresponding one of the lower sub-latch blocks 118_01-118_04, and each corresponding one of the lower sub-cache blocks 119_01-119_04 may be electrically connected to each other, respectively.

Referring to FIG. 6B, four of the upper and lower sub-cache blocks 114_01-114_04 and 119_01-119_04 may be electrically connected to the upper sub-common column decoder block 115t, and the other four of the upper and lower sub-cache blocks 114_01-114_04 and 119_01-119_04 may be electrically connected to the lower sub-common column decoder block 115b. Referring to FIG. 6C, four of the upper and lower sub-cache blocks 114_01-114_04 and 119_01-119_04 may be electrically connected to the left sub-common column decoder block 115L, and the other four of the upper and lower sub-cache blocks 114_01-114_04 and 119_01-119_04 may be electrically connected to the right sub-common column decoder block 115R. The inventive concepts of the embodiment may be understood in more detail with reference to FIGS. 3B and 3C.

Figure 6D:
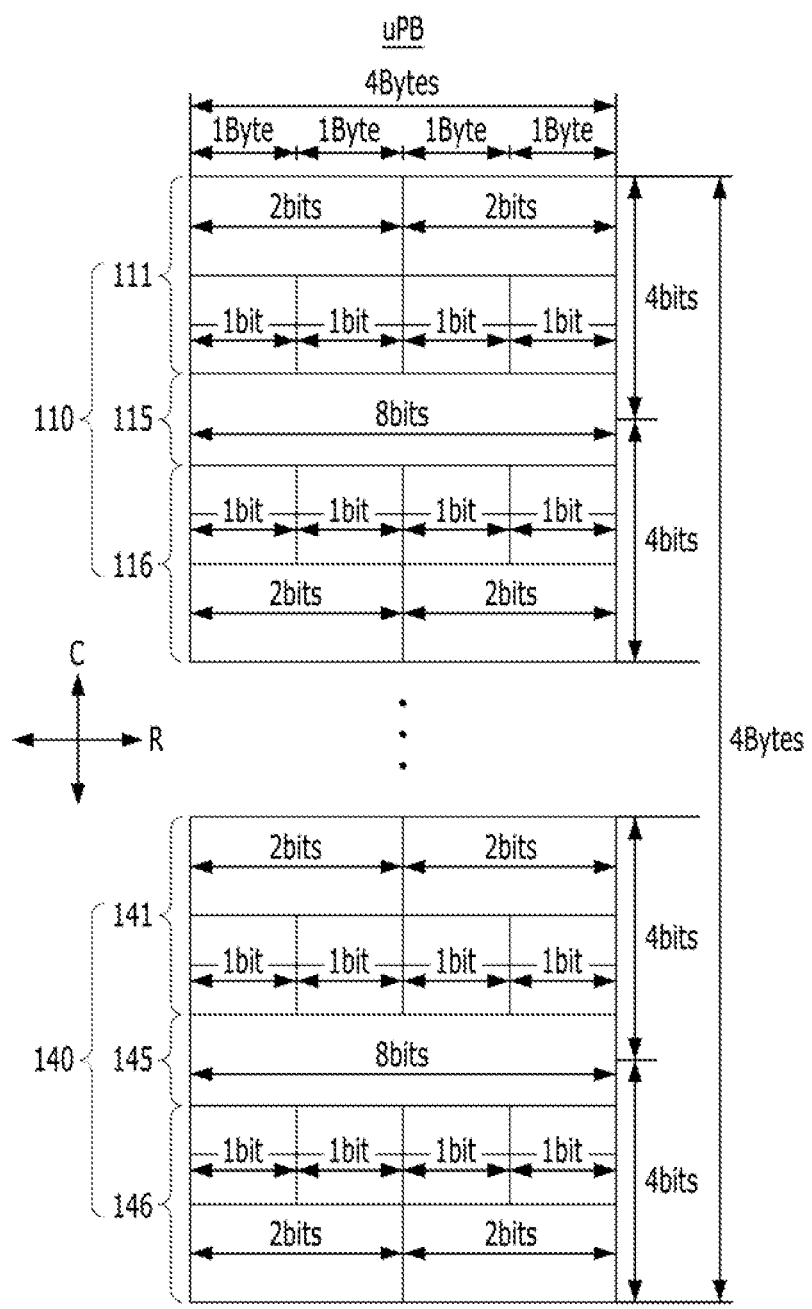

FIG. 6D is a block diagram illustrating an array configuration of a unit page buffer block uPB according to an embodiment of the present disclosure. Referring to FIGS. 6B to 6D, each of the upper and lower sub-latch blocks 113_01-113_04 and 118_01-118_04 and each of the upper and lower sub-cache blocks 114_01-114_04 and 119_01-119_04 may have a 1-bit array configuration. Because four of the upper and lower sub-latch blocks 113_01-113_04 and 118_01-118_04, and the upper and lower sub-cache blocks 114_01-114_04 and 119_01-119_04 are arranged in the row direction R in each of the upper and lower page buffer stages 111 and 116, the upper and lower latch blocks 113 and 118 and the upper and lower cache blocks 114 and 119 may each have a 4-bit array configuration in each of the page buffer stages 111 and 116. As described with reference to FIGS. 4B, the upper and lower unit selection blocks 112_1a, 112_1b, 112_2a, 112_b, 117_1a, 117_1b, 117_2a, and 117_b of each of the upper and lower sub-selection blocks 112_1, 112_2, 117_1, and 117_2 may have a 1-bit array configuration. Accordingly, each of the upper and lower sub-selection blocks 112_1, 112_2, 117_1, and 117_2 may have a 2-bit array configuration. Because two of the upper and lower sub-selection blocks 112_1, 112_2, 117_1, and 117_2 are arranged in the row direction R in each of the upper and lower page buffer stages 111 and 116, the upper and lower selection blocks 112 and 117 may each have 4-bit array configurations in each of the upper and lower page buffer stages 111 and 116.

Each of the upper and lower sub-common column decoder blocks 115t and 115b may have an 8-bit array configuration (see, e.g., FIG. 6B). Because the page buffer pair 110 includes two sub-common column decoder blocks 115t and 115b, the common column decoder block 115 may have a 16-bit array configuration in the page buffer pair 110. For example, as described above, the common column decoder block 115 may be divided into upper and lower common column decoder blocks 115t and 115b in the page buffer pair 110, respectively. Accordingly, the common column decoder block 115 may have two 8-bit array configurations.

Each of the upper and lower page buffer stages 111 and 116 may have a 4-bit array configuration, and the page buffer pair 110 may have an 8-bit array configuration. Because the unit page buffer block uPB includes four page buffer pairs 110, 120, 130, and 140 (i.e., eight page buffer stages 111, 116, 121, 126, 131, 136, 141, and 146) arranged in the column direction C, that is the bit lines extending direction, the unit page buffer block uPB may have a 4-byte array configuration (i.e., 32 bit lines).

Figure 6E:
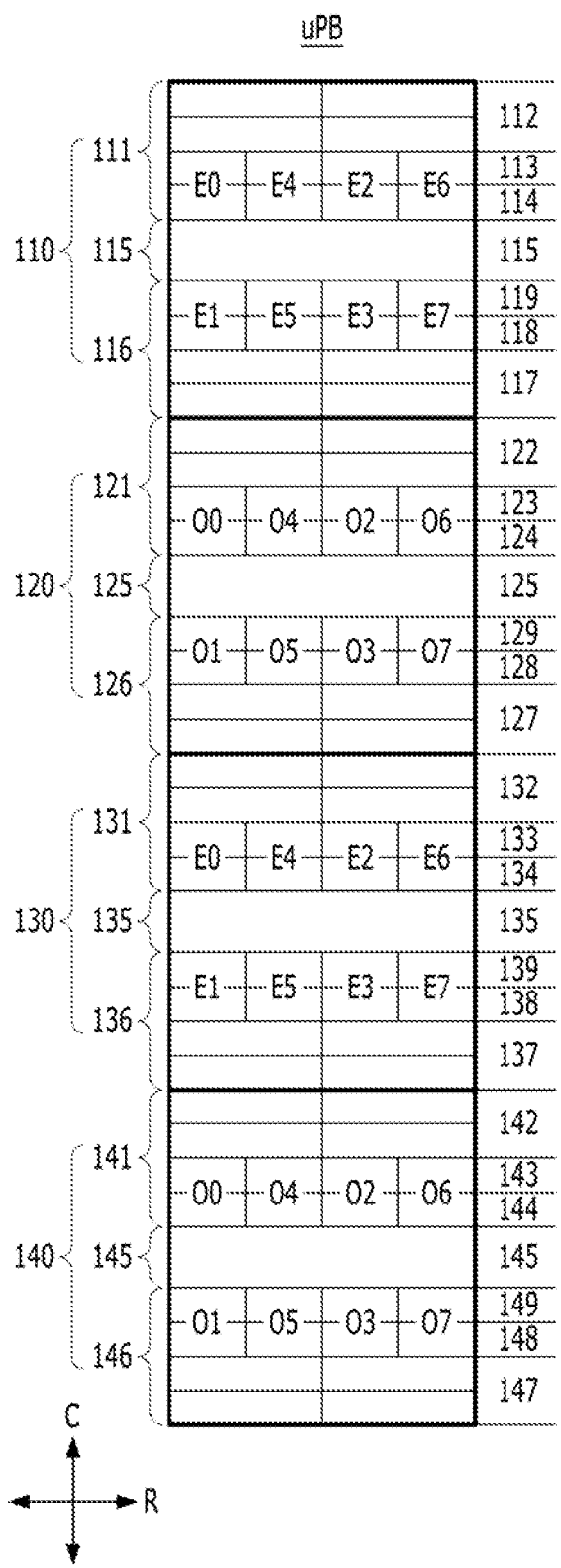

FIG. 6E is a diagram illustrating array configurations of even page buffers and odd page buffers of the unit page buffer block uPB arranged in the page buffer circuit 940 in the memory cell array 800 of a semiconductor memory device according to the embodiment of the present disclosure. Referring to FIGS. 6E, and with further reference to FIGS. 5A and 5B, the first page buffer pair 110 of the unit page buffer block uPB may be electrically connected to bit lines E0, E1, E4, and E5; and the second page buffer pair 120 may be electrically connected to bit lines O0, O1, O4, and O5; the third page buffer pair 130 may be electrically connected to bit lines E2, E3, E6, and E7; and the fourth page buffer pair 140 may be electrically connected bit lines O2, O3, O6, and O7. That is, the upper and lower selection blocks 112, 117, 132, and 137, the upper and lower latch blocks 113, 118, 133, and 138, the upper and lower cache blocks 114, 119, 134, and 139, and the common column decoder blocks 115 and 135 of the first and third page buffer pairs 110 and 130 may be connected to the even bit lines, and the upper and lower selection blocks 122, 127, 142, and 147, the upper and lower latch blocks 123, 128, 143, and 148, the upper and lower cache blocks 124, 129, 144, and 149, and the common column decoder blocks 125 and 145 of the second and fourth page buffer pairs 120 and 140 may be connected to the odd bit lines. Each of the common column decoder blocks 115, 125, 135, and 145 may be selectively connected to even bit lines or odd bit lines. That is, a common column decoder block may not be simultaneously connected to the even bit lines and the odd bit lines.

Figure 7A:
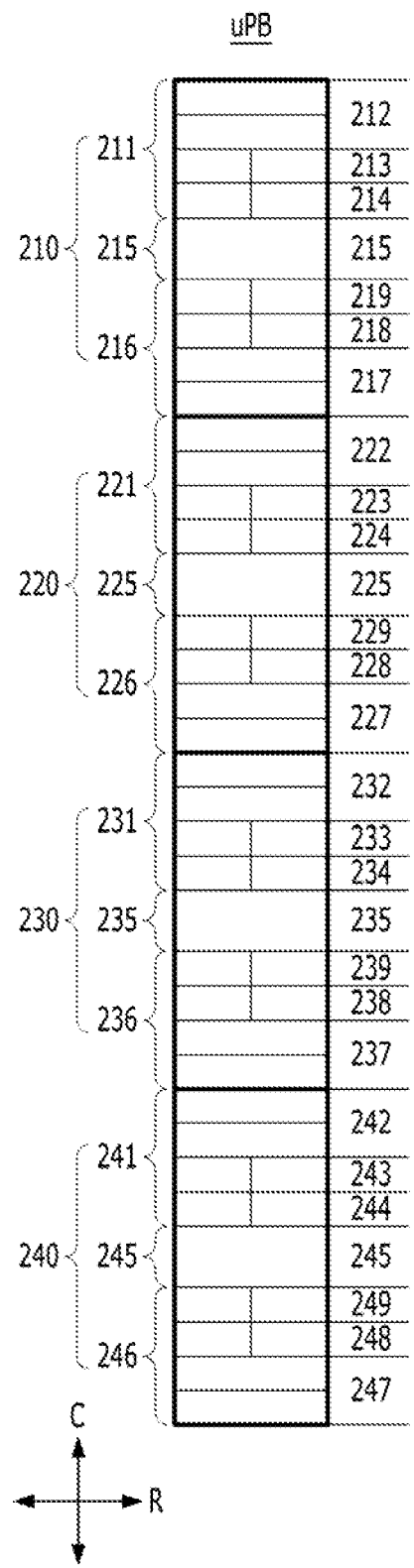
FIGS. 7A to 7E are block diagrams illustrating an arrangement and electrical connections of circuit blocks in a unit page buffer block according to an embodiment of the present disclosure.
Figure 7B:
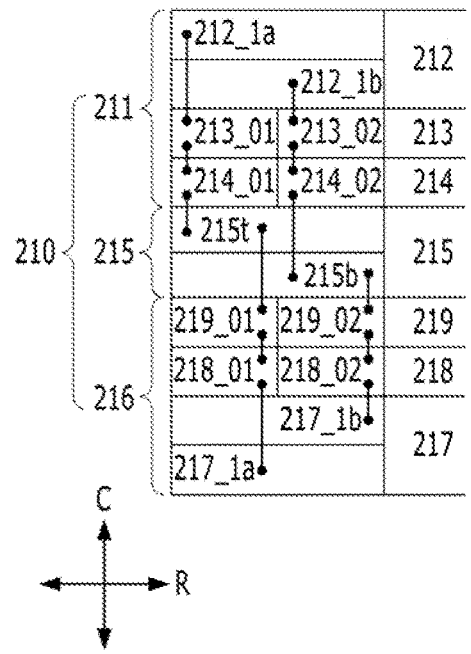
Figure 7C:
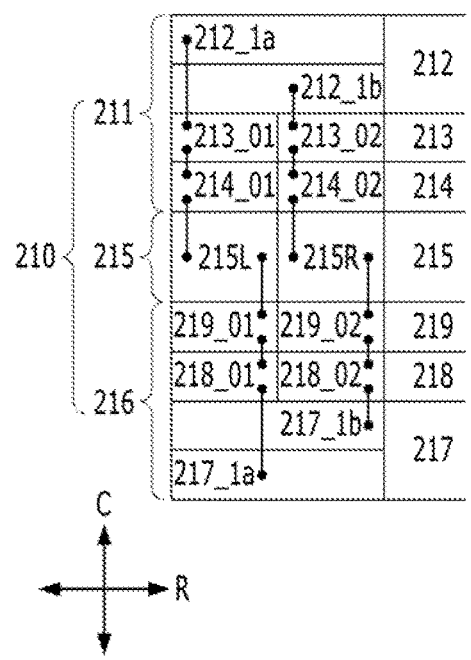

FIGS. 7A to 7E are block diagrams illustrating an arrangement and electrical connections of circuit blocks in a unit page buffer block of a semiconductor memory device according to an embodiment of the present disclosure. Referring to FIGS. 7A to 7C, the unit page buffer block uPB in the page buffer circuit 940 of a semiconductor memory device according to an embodiment of the present disclosure may include first to fourth page buffer pairs 210, 220, 230, and 240 arranged in the column direction C. Each of the first to fourth page buffer pairs 210, 220, 230, and 240 may include one of the first to fourth common column decoder blocks 215, 225, 235 and 245, one of the first to fourth upper page buffer stages 211, 221, 231, and 241, and one of the first to fourth lower page buffer stages 216, 226, 236, and 246. Specifically, the first page buffer pair 210 may include the first common column decoder block 215, the first upper page buffer stage 211, and the first lower page buffer stage 216; the second page buffer pair 220 may include the second common column decoder block 225, the second upper page buffer stage 221, and the second lower page buffer stage 226; the third page buffer pair 230 may include the third common column decoder block 235, the third upper page buffer stage 231, and the third lower page buffer stage 236; and the fourth page buffer pair 240 may include the fourth common column decoder block 245, the fourth upper page buffer stage 241, and the fourth lower page buffer stage 246. That is, the unit page buffer block uPB may include the eight page buffer stages 211, 216, 221, 226, 231, 236, 241, and 246. One of the corresponding upper page buffer stages 211, 221, 231, and 241 and one of the corresponding lower page buffer stages 216, 226, 236, and 246 may be electrically connected to one of the corresponding common column decoder blocks 215, 225, 235, and 245. Specifically, the first upper page buffer stage 211 and the first lower page buffer stage 216 may be commonly connected to the first common column decoder block 215, the second upper page buffer stage 221 and the second lower page buffer stage 226 may be commonly connected to the second common column decoder block 225, the third upper page buffer stage 231 and the third lower page buffer stage 236 may be commonly connected to the third common column decoder block 235, and the fourth upper page buffer stage 241 and the fourth lower page buffer stage 246 may be commonly connected to the fourth common column decoder block 245. Each of the corresponding upper page buffer stages 211, 221, 231, and 241 and each of the corresponding lower page buffer stages 216, 226, 236, and 246 may be arranged symmetrically or mirrored to each other in the column direction C.

Although only the configuration of the first page buffer pair 210 is representatively illustrated in FIGS. 7B and 7C, the second to fourth page buffer pairs 220, 230, and 240 may also have the same configuration as the first page buffer pair 210. Therefore, 'first' is omitted from the first page buffer pair 110 in the following description. Referring to FIGS. 7B and 7C, the upper page buffer stage 211 may include the upper selection block 212, the upper latch block 213, and the upper cache block 214 arranged in the column direction C. The lower page buffer stage 216 may include the lower selection block 217, the lower latch block 218, and the lower cache block 219 arranged in the column direction C.

The upper selection block 212 may include two upper unit selection blocks 212_1a and 212_1b arranged in the column direction C, and the lower selection block 217 may include two lower unit selection blocks 217_1a and 217_1b arranged in the column direction C.

The upper latch block 213 may include two upper sub-latch blocks 213_01 and 213_02 arranged in the row direction R, and the lower latch block 218 may include two lower sub-latch blocks 218_01 and 218_02 arranged in the row direction R.

The upper cache block 214 may include two upper sub-cache blocks 214_01 and 214_02 arranged in the row direction R, and the lower cache block 219 may include two lower sub-cache blocks 219_01 and 219_02 arranged in the row direction R.

Referring to FIG. 7B, the common column decoder block 215 may include an upper sub-common column decoder block 215t and a lower sub-common column decoder block 215b arranged in the column direction C. Referring to FIG. 7C, the common column decoder block 215 may include a left sub-common column decoder block 215L and a right sub-common column decoder block 215R arranged in the row direction R.

Referring to 7B and 7C, each corresponding one of the upper unit selection blocks 212_1a and 212_1b, each corresponding one of the upper sub-latch blocks 213_01 and 213_02, and each corresponding one of the upper sub-cache blocks 214_01 and 214_02 may be electrically connected to each other, respectively, and each corresponding one of the lower unit selection blocks 217_1a and 217_1b, each corresponding one of the lower sub-latch blocks 218_01 and 218_02, and each corresponding one of the lower sub-cache blocks 219_01 and 219_02 may be electrically connected to each other respectively in the column direction.

Referring to FIG. 7B, two of the upper and lower sub-cache blocks 214_01, 214_02, 219_01, and 219_02 may be connected to the upper sub-common column decoder block 215t, and other two of the upper and lower sub-cache blocks 214_01, 214_02, 219_01, and 219_02 may be connected to the lower sub-common column decoder block 215b. Referring to FIG. 7C, two of the upper and lower sub-cache blocks 214_01, 214_02, 219_01, and 219_02 may be connected to the left sub-common column decoder block 215L, and other two of the upper and lower sub-cache blocks 214_01, 214_02, 219_01, and 219_02 may be connected to the right sub-common column decoder block 215R. The inventive concepts according to the present embodiment may be understood in more detail with reference to FIGS. 3B and 3C.

Figure 7D:
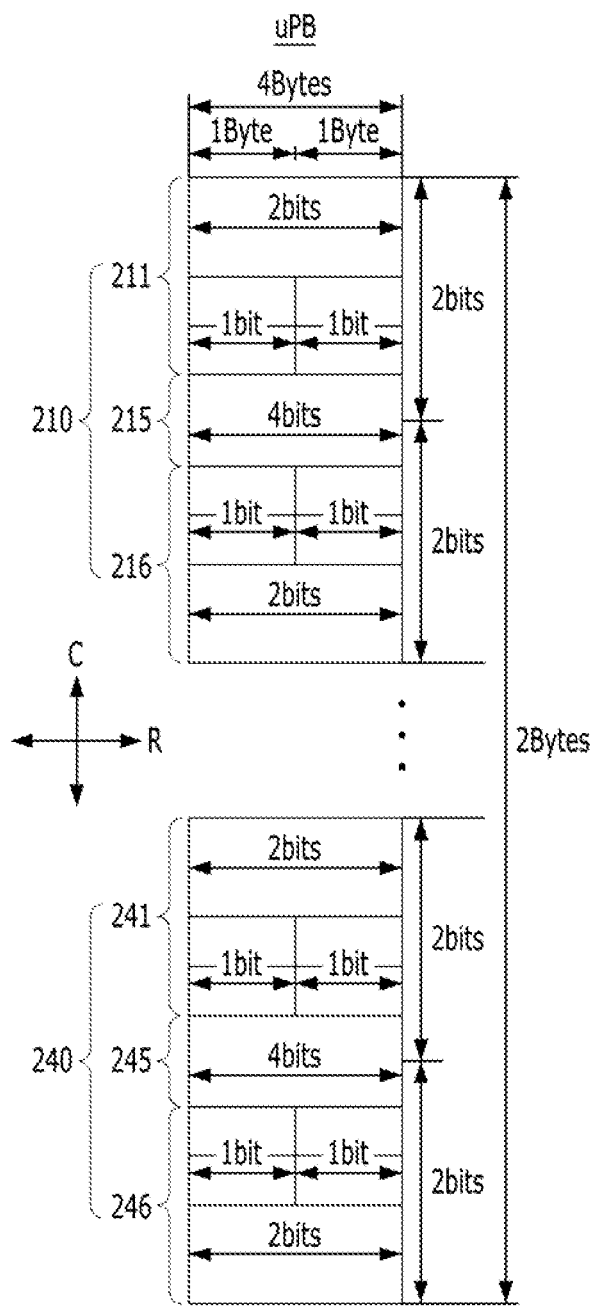

FIG. 7D is a block diagram illustrating an array configuration of the unit page buffer block uPB according to an embodiment of the present disclosure. Referring to FIGS. 7B to 7D, each of upper and lower the sub-latch blocks 213_01, 213_02, 218_01, and 218_02, and each of the upper and lower sub-cache blocks 214_01, 214_02, 219_01, and 219_02 may have a 1-bit array configuration. Because two upper sub-latch blocks 213_01 and 213_02, and two sub-cache blocks 214_01 and 214_02, are arranged in the row direction R in the upper page buffer stage 211, the upper latch block 213 and the upper cache block 214 may each have a 2-bit array configuration in the upper page buffer stage 211. Because two lower sub-latch blocks 218_01 and 218_02, and two lower sub-cache blocks 219_01 and 219_02 are arranged in the row direction R in the lower page buffer stage 216, the lower latch block 218 and the lower cache block 219 may each have a 2-bit array configuration in the lower page buffer stage 216. As described with reference to FIG. 4B, each of the unit selection blocks 212_1a, 212_1b, 217_2a, and 217_2b may have a 1-bit array configuration. Accordingly, each of the upper and lower selection blocks 212 and 217 may have a 2-bit array configuration.

Each of the upper and lower sub-common column decoder blocks 215t and 215b may have a 2-bit array configuration. As described above, the common column decoder block 215 in the page buffer pair 210 may be divided into two and included in the upper and lower page buffer stages 211 and 216, respectively. Accordingly, the common column decoder block 215 may have two 2-bit array configurations, that is, a 4-bit array configuration.

Each of the upper and lower page buffer stages 211 and 216 may have a 2-bit array configuration, and the page buffer pair 210 may have a 4-bit array configuration. Because of the unit page buffer block uPB includes four page buffer pairs 210, 220, 230, and 240 (i.e., eight page buffer stages 211, 216, 221, 226, 231, 236, 241, and 246) arranged in the column direction C, that is the bit lines extending direction, the unit page buffer block uPB may have a 2-byte array configuration (i.e., 16 bit lines).

Figure 7E:
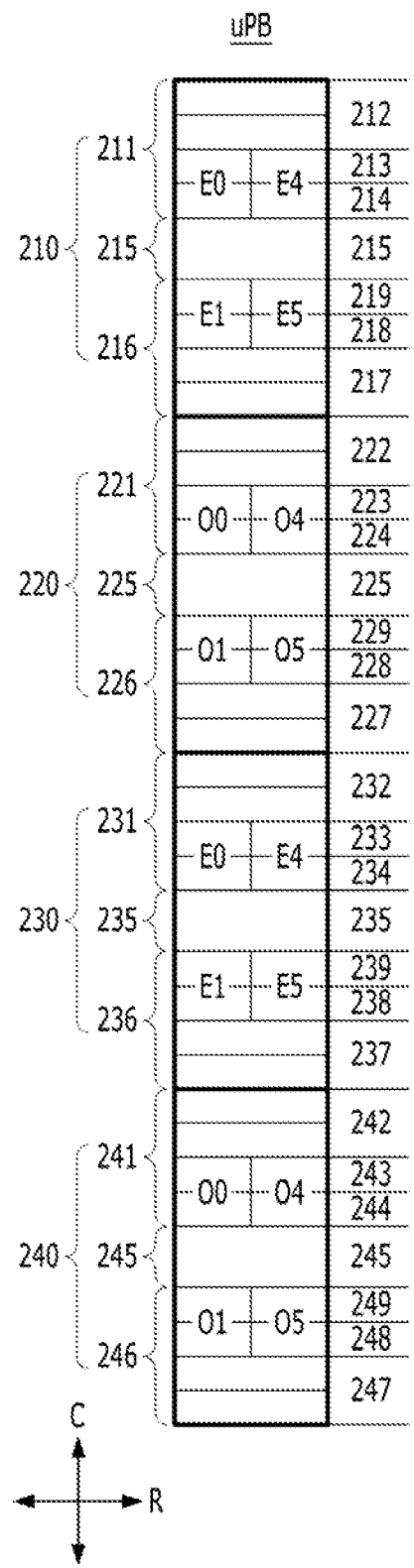

FIG. 7E is a diagram illustrating array configurations of even page buffers and odd page buffers of the unit page buffer block uPB arranged in the page buffer circuit 940 in a memory cell array 800 of a semiconductor memory device according to an embodiment of the present disclosure. Referring to FIG. 7E, with further reference to FIGS. 5A and 5B, the first page buffer pair 210 of the unit page buffer block uPB may be electrically connected to bit lines E0, E1, E4, and E5; the second page buffer pair 220 may be electrically connected to bit lines O1, O4, and O5; the third page buffer pair 230 may be electrically connected to bit lines E2, E3, E6, and E7; and the fourth page buffer pair 240 may be electrically connected to bit lines O2, O3, O6, and O7. That is, the upper and lower selection blocks 212, 217, 232, and 237, the upper and lower latch blocks 213, 218, 233, and 238, the upper and lower cache blocks 214, 219, 234, and 239, and the common column decoder blocks 215 and 235 of the first and third page buffer pairs 210 and 230 may be connected to the even bit lines, and the upper and lower selection blocks 222, 227, 242, and 247, the upper and lower latch blocks 223, 228, 243, and 248, the upper and lower cache blocks 224, 229, 244, and 249, and the common column decoder blocks 225 and 245 of the second and fourth page buffer pairs 220 and 240 may be connected to the odd bit lines. Each of the common column decoder blocks 215, 225, 235, and 245 may be selectively connected to even bit lines or odd bit lines. That is, the common column decoder blocks 215, 225, 235, and 245 are not simultaneously connected to even bit lines and odd bit lines.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
a unit page buffer block including first to fourth page buffer pairs arranged in a column direction,
wherein each of the first to fourth page buffer pairs includes:
a common column decoder block; and
an upper page buffer stage and a lower page buffer stage electrically and commonly connected to the common column decoder block,
wherein each the upper page buffer stage includes:
an upper selection block;
an upper latch block; and
an upper cache block,
wherein each the lower page buffer stage includes:
a lower selection block;
a lower latch block; and
a lower cache block,
wherein each the upper selection block includes first to fourth sub-selection blocks arranged in a row direction,
wherein each the upper latch block includes first to twelfth upper sub-latch blocks arranged in the row direction,
wherein each the upper cache block includes first to twelfth upper sub-cache blocks arranged in the row direction,
wherein each the lower selection block includes first to fourth sub-section blocks arranged in the row direction,
wherein each the lower latch block includes first to twelfth lower sub-latch blocks arranged in the row direction,
wherein each the lower cache block includes first to twelfth lower sub-cache blocks arranged in the row direction, and
wherein each the common column decoder block includes first to third sub-common column decoder blocks arranged in the row direction.

2. The semiconductor memory device of claim 1, wherein each of the first to third sub-common column decoder blocks includes an upper sub-common column decoder block and a lower sub-common column decoder block.

3. The semiconductor memory device of claim 2, wherein:
the first and second upper sub-cache blocks and the first and second lower sub-cache blocks are electrically connected to the upper sub-common column decoder block of the first sub-common column decoder block,
the third and fourth upper sub-cache blocks and the third and fourth lower sub-cache blocks are electrically connected to the lower sub-common column decoder block of the first sub-common column decoder block,
the fifth and sixth upper sub-cache blocks and the fifth and sixth lower sub-cache blocks are electrically connected to the upper sub-common column decoder block of the second sub-common column decoder block,
the seventh and eighth upper sub-cache blocks and the seventh and eighth sub-cache blocks are electrically connected to the lower sub-common column decoder block of the second sub-common column decoder block,
the ninth and tenth upper sub-cache blocks and the ninth and tenth lower sub-cache blocks are electrically connected to the upper sub-common column decoder block of the third sub-common column decoder block, and
the eleventh and twelfth upper sub-cache blocks and the eleventh and twelfth lower sub-cache blocks are electrically connected to the lower sub-common column decoder block of the third sub-common column decoder block.

4. The semiconductor memory device of claim 1, wherein each of the first to third sub-common column decoder blocks includes a left sub-common column decoder block and a right sub-common column decoder block.

5. The semiconductor memory device of claim 4, wherein:
the first and second upper sub-cache blocks and the first and second lower sub-cache blocks are electrically connected to the left sub-common column decoder block of the first sub-common column decoder block,
the third and fourth upper sub-cache blocks and the third and fourth lower sub-cache blocks are electrically connected to the right sub-common column decoder block of the first sub-common column decoder block,
the fifth and sixth upper sub-cache blocks and the fifth and sixth lower sub-cache blocks are electrically connected to the left sub-common column decoder block of the second sub-common column decoder block,
the seventh and eighth upper sub-cache blocks and the seventh and eighth lower sub-cache blocks are electrically connected to the right sub-common column decoder block of the second sub-common column decoder block,
the ninth and the tenth upper sub-cache blocks and the ninth and tenth lower sub-cache blocks are electrically connected to the left sub-common column decoder block of the third sub-common column decoder block, and
the eleventh and twelfth sub-cache blocks and the eleventh and twelfth lower sub-cache blocks are electrically connected to the right sub-common column decoder block of the third sub-common column decoder block.

6. The semiconductor memory device of claim 1, wherein:

the first to third upper latch blocks are electrically connected to the first upper sub-selection block,
the fourth to sixth upper latch blocks are electrically connected to the second upper sub-selection block,
the seventh to ninth upper latch blocks are electrically connected to the third upper sub-selection block,
the tenth to twelfth upper latch blocks are electrically connected to the fourth upper sub-selection block,
the first to third lower latch blocks are electrically connected to the first lower sub-selection block,
the fourth to sixth lower latch blocks are electrically connected to the second lower sub-selection block,
the seventh to ninth lower latch blocks are electrically connected to the third lower sub-selection block, and
the tenth to twelfth lower latch blocks are electrically connected to the fourth lower sub-selection block.

7. The semiconductor memory device of claim 6, wherein:
each of the first to fourth upper sub-selection blocks includes first to third upper unit selection blocks arranged in the column direction,
each of the first to fourth lower sub-selection blocks includes first to third unit selection blocks arranged in the column direction,
each of the first to third upper latch blocks is electrically connected to the upper first to third unit selection blocks of the first sub-selection block, respectively,
each of the fourth to sixth upper latch blocks is electrically connected to the upper first to third upper unit selection blocks of the second upper sub-selection block, respectively,
each of the seventh to ninth upper latch blocks is electrically connected to the first to third upper unit selection blocks of the upper third sub-selection block, respectively,
each of the tenth to twelfth upper latch blocks is electrically connected to the first to third upper unit selection blocks of the fourth upper sub-selection block, respectively,
each of the first to third lower latch blocks is electrically connected to the first to third lower unit selection blocks of the first lower sub-selection block, respectively,
each of the fourth to sixth lower latch blocks is electrically connected to the first to third lower unit selection blocks of the second lower sub-selection block, respectively,
each of the seventh to ninth lower latch blocks is electrically connected to the first to third lower unit selection blocks of the third lower sub-selection block, respectively, and
each of the tenth to twelfth lower latch blocks is electrically connected to the first to third lower unit selection blocks of the fourth lower sub-selection block, respectively.

8. The semiconductor memory device of claim 1, wherein:
each of the first to twelfth upper sub-latch blocks is electrically connected to a corresponding one of the first to twelfth upper sub-cache blocks, and
each of the first to twelfth lower sub-latch blocks is electrically connected to a corresponding one of the first to twelfth lower sub-cache blocks.

9. The semiconductor memory device of claim 1, wherein:
the first upper sub-latch blocks and the first lower sub-latch blocks intersect a first bit line set,
the second upper sub-latch blocks and the second lower sub-latch blocks intersect a second bit line set,
the third upper sub-latch blocks and the third lower sub-latch blocks intersect a third bit line set,
the fourth upper sub-latch blocks and the fourth lower sub-latch blocks intersect a fourth bit line set,
the fifth upper sub-latch blocks and the fifth lower sub-latch blocks intersect a fifth bit line set,
the sixth upper sub-latch blocks and the sixth lower sub-latch blocks intersect a sixth bit line set,
the seventh upper sub-latch blocks and the seventh lower sub-latch blocks intersect a seventh bit line set,
the eighth upper sub-latch blocks and the eighth lower sub-latch blocks intersect an eighth bit line set,
the ninth upper sub-latch blocks and the ninth lower sub-latch blocks intersect a ninth bit line set,
the tenth upper sub-latch blocks and the tenth lower sub-latch blocks intersect a tenth bit line set,
the eleventh upper sub-latch blocks and the eleventh lower sub-latch blocks intersect an eleventh bit line set,
the twelfth upper sub-latch blocks and the twelfth lower sub-latch blocks intersect a twelfth bit line set, and
each of the first to twelfth bit line sets includes eight bit lines extending in the column direction.

10. The semiconductor memory device of claim 9, wherein the bit lines extending in the column direction include:
even bit lines that are electrically connected to one of the first common column decoder block or the third common column decoder block, and
odd bit lines that are electrically connected to one of the second common column decoder block or the fourth common column decoder block.

11. The semiconductor memory device of claim 10, wherein:
bit lines E0, E1, E4 and E5 of the even bit lines are electrically connected to the first common column decoder block,
bit lines O0, O1, O4 and O5 of the odd bit lines are electrically connected to the second common column decoder block,
bit lines E2, E3, E6 and E7 of the even bit lines are electrically connected to the third common column decoder block, and
bit lines O2, O3, O6 and O7 of the odd bit lines are electrically connected to the fourth common column decoder block.

12. The semiconductor memory device of claim 1, wherein the first to fourth upper page buffer stages and the corresponding first to fourth lower page buffer stages are symmetric with respect to the first to the fourth common column decoder, respectively.

13. A semiconductor memory device comprising:
a unit page buffer block including four page buffer pairs arranged in a column direction,
wherein each of the four page buffer pairs comprises:
a common column decoder block; and
an upper page buffer stage and a lower page buffer stage, each electrically and commonly connected to the common column decoder block,
wherein the upper buffer stage comprises:
an upper selection block;
an upper latch block; and
an upper cache block,
wherein the lower buffer stage comprises:
a lower selection block;
a lower latch block; and
a lower cache block, wherein:
the upper selection block includes a plurality of upper sub-selection blocks arranged in a row direction, and each of the plurality of upper sub-selection blocks includes a plurality of upper unit selection blocks,
the upper latch block includes a plurality of upper sub-latch blocks arranged in the row direction,
the upper cache block includes a plurality of upper sub-cache blocks arranged in the row direction,
each of the plurality of upper unit selection blocks, each of the plurality of upper sub-latch blocks, and each of the plurality of upper sub-cache blocks are electrically connected to each other,
the lower selection block includes a plurality of lower sub-selection blocks arranged in the row direction, and each of the plurality of lower sub-selection blocks includes a plurality of lower unit selection blocks,
the lower latch block includes a plurality of lower sub-latch blocks arranged in the row direction,
the lower cache block includes a plurality of lower sub-cache blocks arranged in the row direction, and
each of the plurality of lower unit selection blocks, the plurality of lower sub-latch blocks, and each of the lower sub-cache blocks are electrically connected to each other.

14. The semiconductor memory device of claim 13, wherein:
the common column decoder block includes first and second sub-common column decoder blocks,
two of the upper sub-cache blocks and two of the lower sub-cache blocks are commonly electrically connected to the first sub-common column decoder block, and
two of the upper sub-cache blocks and two of the lower sub-cache blocks are commonly electrically connected to the second sub-common column decoder block.

15. The semiconductor memory device of claim 13, further comprising:
a plurality of bit line sets arranged to intersect the unit page buffer block in the column direction,
wherein:
each of the plurality of bit line sets includes eight bit lines, and
each of the bit lines is electrically connected to a corresponding one of the plurality of upper and lower unit selection blocks.

16. The semiconductor memory device of claim 15, wherein:
even bit lines of the bit lines are electrically connected to one of the first common column decoder block or the third common column decoder block, and
odd bit lines of the bit lines that are electrically connected to one of the second common column decoder block or the fourth common column decoder block.

17. A semiconductor memory device comprising:
a unit page buffer block including first to fourth page buffer pairs arranged in a column direction,
wherein each of the first to fourth page buffer pairs comprises:
a common column decoder block; and
an upper page buffer stage and a lower page buffer stage electrically connected to a corresponding common column decoder block,
wherein the common column decoder block includes first and second sub-common column decoder blocks,
wherein the upper page buffer stage comprises:
an upper selection block;
an upper latch block; and
an upper cache block,
wherein the lower page buffer stage comprises:
a lower selection block;
a lower latch block; and
a lower cache block,
wherein:
the upper selection block includes a first upper unit selection block and a second upper unit selection block arranged in the column direction;
the upper latch block includes first and second upper sub-latch blocks arranged in the row direction,
the upper cache block includes first and second upper sub-cache blocks arranged in the row direction,
the lower selection block includes a first upper unit selection block and a first lower unit selection block arranged in the column direction,
the lower latch block includes first and second lower sub-latch blocks arranged in the row direction,
the lower cache block includes first and second lower sub-cache blocks arranged in the row direction,
the first upper unit selection block, the first upper sub-latch block, and the first upper sub-cache block are electrically connected to each other,
the second upper unit selection block, the second upper sub-latch block, and the second upper sub-cache block are electrically connected to each other,
the first lower unit selection block, the first lower sub-latch block, and the first lower sub-cache block are electrically connected to each other,
the second lower unit selection block, the second lower sub-latch block, and the second lower sub-cache block are electrically connected to each other,
the first upper sub-cache block and the first lower sub-cache block are commonly electrically connected to the first sub-common column decoder, and
the second upper sub-cache block and the second lower sub-cache block are commonly electrically connected to the second sub-common column decoder block.

18. The semiconductor memory device of claim 17, wherein:
the first upper sub-latch blocks and the first lower sub-latch blocks intersect a first bit line set,
the second upper sub-latch blocks and the second lower sub-latch blocks intersect a second bit line set,
each of the first and second bit line sets includes eight bit lines extending in the column direction,
even bit lines of the bit lines are electrically connected to the common column decoder block of the first page buffer pair and the common column decoder block of the third page buffer pair, and
odd bit lines of the bit lines are electrically connected to the common column decoder block of the second page buffer pair and the common column decoder block of the fourth page buffer pair.

19. The semiconductor memory device of claim 18, wherein:
even bit lines E0, E1, E4, and E5 of the even bit lines are electrically connected to the common column decoder block of the first page buffer pair,
odd bit lines O0, O1, O4, and O5 of the odd bit lines are electrically connected to the common column decoder block of the second page buffer pair,
even bit lines E2, E3, E6, and E7 of the even bit lines are electrically connected to the common column decoder block of the third page buffer pair, and
odd bit lines O2, O3, O6, and O7 of the odd bit lines are electrically connected to the common column decoder block of the fourth page buffer pair.

* * * * *